(12) United States Patent
Komiya et al.

(10) Patent No.: US 11,637,358 B2
(45) Date of Patent: Apr. 25, 2023

(54) CARRIER-CONTAINING METAL FOIL AND METHOD FOR MANUFACTURING MILLIMETER-WAVE ANTENNA SUBSTRATE USING SAME

(71) Applicant: MITSUI MINING & SMELTING CO., LTD., Tokyo (JP)

(72) Inventors: Mikiko Komiya, Ageo (JP); Takenori Yanai, Ageo (JP); Rintaro Ishii, Ageo (JP); Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 160 days.

(21) Appl. No.: 17/292,196

(22) PCT Filed: Nov. 19, 2019

(86) PCT No.: PCT/JP2019/045286
§ 371 (c)(1),
(2) Date: May 7, 2021

(87) PCT Pub. No.: WO2020/105638
PCT Pub. Date: May 28, 2020

(65) Prior Publication Data
US 2021/0328325 A1  Oct. 21, 2021

(30) Foreign Application Priority Data

Nov. 20, 2018 (JP) .............................. JP2018-217756
Jun. 26, 2019 (JP) .............................. JP2019-118303
Sep. 30, 2019 (JP) .............................. JP2019-180631

(51) Int. Cl.
*H01Q 1/22* (2006.01)
*B32B 15/04* (2006.01)
(Continued)

(52) U.S. Cl.
CPC ........... *H01Q 1/2283* (2013.01); *B32B 15/04* (2013.01); *H01Q 1/422* (2013.01); *H05K 1/09* (2013.01)

(58) Field of Classification Search
CPC ...... H01Q 1/2283; H01Q 1/422; B32B 15/04; H05K 1/09
(Continued)

(56) References Cited

U.S. PATENT DOCUMENTS

2014/0054259 A1  2/2014  Tateoka et al.
2014/0096381 A1  4/2014  Tateoka et al.
(Continued)

FOREIGN PATENT DOCUMENTS

JP  2005-101137  4/2005
JP  2007/307767  11/2007
(Continued)

*Primary Examiner* — Peguy Jean Pierre
(74) *Attorney, Agent, or Firm* — Greenblum & Bernstein, P.L.C.

(57) ABSTRACT

Provided is a carrier-attached metal foil which has excellent carrier-releasability and excellent selective metal layer-etchability, and can achieve a reduction in transmission loss and resistance in a semiconductor package (for example, a millimeter-wave antenna substrate) manufactured using the same. The carrier-attached metal foil includes: (a) a carrier; (b) a release functional layer on the carrier and including (b1) an adhesion layer disposed closer to the carrier and having a thickness of more than 10 nm and less than 200 nm and (b2) a release assistance layer disposed farther from the carrier and having a thickness of 50 nm or more and 500 nm or less; and (c) a composite metal layer on the release functional layer and including (c1) a carbon layer disposed closer to the release assistance layer, and (c2) a first metal layer disposed farther from the release assistance layer and mainly composed of Au or Pt.

11 Claims, 15 Drawing Sheets

(51) Int. Cl.
*H01Q 1/42* (2006.01)
*H05K 1/09* (2006.01)

(58) Field of Classification Search
USPC .......................................................... 343/702
See application file for complete search history.

(56) References Cited

U.S. PATENT DOCUMENTS

2019/0013212 A1    1/2019  Matsuura
2019/0029125 A1    1/2019  Matsuura
2021/0050512 A1*   2/2021  Fugazza .............. H01L 27/2463

FOREIGN PATENT DOCUMENTS

| JP | 5859155    | 2/2016  |
| WO | 2012/133637 | 10/2012 |
| WO | 2012/133638 | 10/2012 |
| WO | 2017/150283 | 9/2017  |
| WO | 2017/150284 | 9/2017  |

* cited by examiner

CARRIER-CONTAINING METAL FOIL AND METHOD FOR MANUFACTURING MILLIMETER-WAVE ANTENNA SUBSTRATE USING SAME

TECHNICAL FIELD

The present invention relates to a carrier-attached metal foil and a method for manufacturing a millimeter-wave antenna substrate using the same.

BACKGROUND ART

In recent years, multilayering of printed wiring boards has gradually prevailed to provide an increased mounting density of the printed wiring board to provide a decreased size thereof. Such multilayer printed wiring boards have been used for reductions in weight and size of many portable electronic devices. A further reduction in the thickness of an interlayer insulating layer and a further reduction in the weight of the wiring board are required for the multilayer printed wiring boards.

As a technique for meeting such requirements, a method for manufacturing a multilayer printed wiring board using a coreless build-up method has been employed. The coreless build-up method alternately laminates (builds up) insulating layers and wiring layers without using a so-called core substrate into a multilayer. In the coreless build-up method, it has been proposed to use a career-attached copper foil to facilitate release between a support and a multilayer printed wiring board. For example, Patent Literature 1 (JP2005-101137A) discloses a method for manufacturing a package substrate for mounting semiconductor devices, including bonding an insulating resin layer to the carrier surface of a carrier-attached copper foil to form a support, and forming a first wiring conductor on the superthin copper layer of the carrier-attached copper foil by a process such as photoresist processing, pattern electrodeposited copper plating, or resist removal, followed by forming a build-up wiring layer, releasing a carrier-attached supporting substrate, and removing the superthin copper layer.

A carrier-attached copper foil including a superthin copper layer having a thickness of 1 urn or less has been desired to miniaturize an embedded circuit as shown in Patent Literature 1. Then, it has been proposed to form a superthin copper layer by a vapor-phase method such as sputtering to achieve a reduction in thickness of the superthin copper layer. For example, Patent Literature 2 (WO2017/150283) discloses a career-attached copper foil obtained by forming a release layer, an antireflection layer, and a superthin copper layer on a career made of glass or a ceramic or the like by sputtering. Patent Literature 3 (WO2017/150284) discloses a career-attached copper foil obtained by forming an interlayer (for example, an adhesion metal layer and a release assistance layer), a release layer, and a superthin copper layer (for example, film thickness: 300 nm) on a career made of glass or a ceramic or the like by sputtering. Patent Literatures 2 and 3 also teach that an interlayer composed of a specific metal is interposed to provide excellent stability of mechanical release strength of the carrier, and an antireflection layer exhibits a desirable dark color to provide improved visibility in image inspection (for example, automatic optical inspection (AOI)).

CITATION LIST

Patent Literature

Patent Literature 1: JP2005-101137A
Patent Literature 2: WO2017/150283
Patent Literature 3: WO2017/150284

SUMMARY OF INVENTION

Incidentally, in recent years, in the automobile field, a safety drive support system such as a collision prevention function has been widely used. In the system, an automotive millimeter wave radar has been utilized. In the information/communication technology field, technical development related to millimeter wave communication allowing broadband securement and large capacity transmission has been advanced. Therefore, the demand for a semiconductor package for millimeter waves (hereinafter referred to as "millimeter-wave antenna substrate") suitable for these applications can also be said to increase. Here, in the manufacture of the millimeter-wave antenna substrate and the like, a minute circuit formation technique using Au plating is used. In this regard, when a millimeter-wave antenna substrate or the like is produced using a conventional career-attached copper foil, the chemical stability of Cu is low, which may disadvantageously cause high resistance (for example, interconnection resistance with Au plating). In the manufacture of the millimeter-wave antenna substrate and the like, a resin (for example, a thickness of 200 μm or more) which is comparatively thick as an insulating layer is laminated on the carrier-attached metal foil to reduce interference, so that the carrier-attached metal foil is apt to be subjected to a stress from the resin, which may cause unstable release of the career.

Now, the present inventors found that, by controlling the thickness of a layer contributing to the release of a career to a specific range and employing a metal layer mainly composed of Au or Pt, a carrier-attached metal foil can be provided, which has excellent carrier-releasability and excellent selective metal layer-etchability, and can achieve a reduction in transmission loss and resistance in a semiconductor package (for example, a millimeter-wave antenna substrate) manufactured using the same.

Therefore, an object of the present invention is to provide a carrier-attached metal foil which has excellent carrier-releasability and excellent selective metal layer-etchability, and can achieve a reduction in transmission loss and resistance in a semiconductor package (for example, a millimeter-wave antenna substrate) manufactured using the same.

According to an aspect of the present invention, there is provided a carrier-attached metal foil comprising:
(a) a carrier;
(b) a release functional layer provided on the carrier, the release functional layer including:
  (b1) an adhesion layer disposed closer to the carrier and having a thickness of more than 10 nm and less than 200 nm; and
  (b2) a release assistance layer disposed farther from the carrier and having a thickness of 50 nm or more and 500 nm or less; and
(c) a composite metal layer provided on the release functional layer, the composite metal layer including:
  (c1) a carbon layer disposed closer to the release assistance layer; and
  (c2) a first metal layer disposed farther from the release assistance layer and mainly composed of Au or Pt.

According to another aspect of the present invention, there is provided a method for manufacturing a millimeter-wave antenna substrate, comprising manufacturing the millimeter-wave antenna substrate using the carrier-attached metal foil.

DESCRIPTION OF EMBODIMENT

Carrier-Attached Metal Foil

Figure 1:
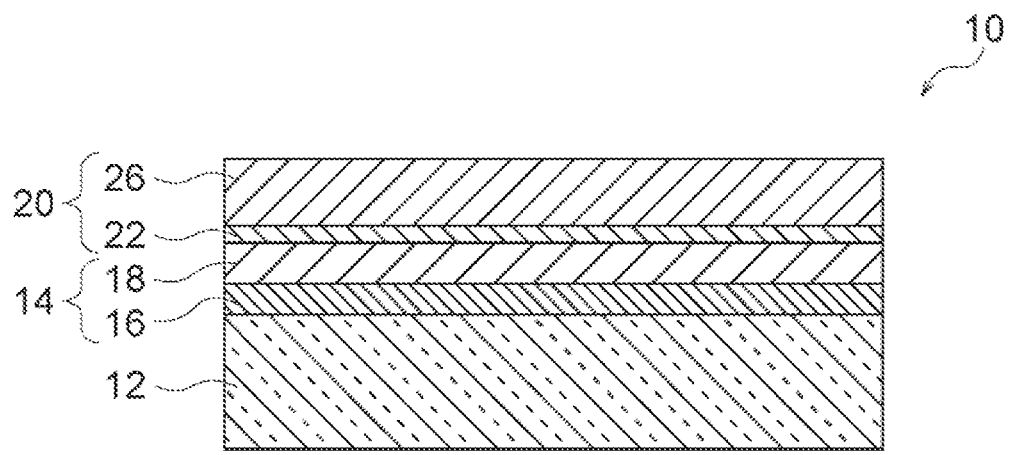
FIG. 1 is a schematic cross-sectional view showing an example of a carrier-attached metal foil of the present invention.
Figure 2:
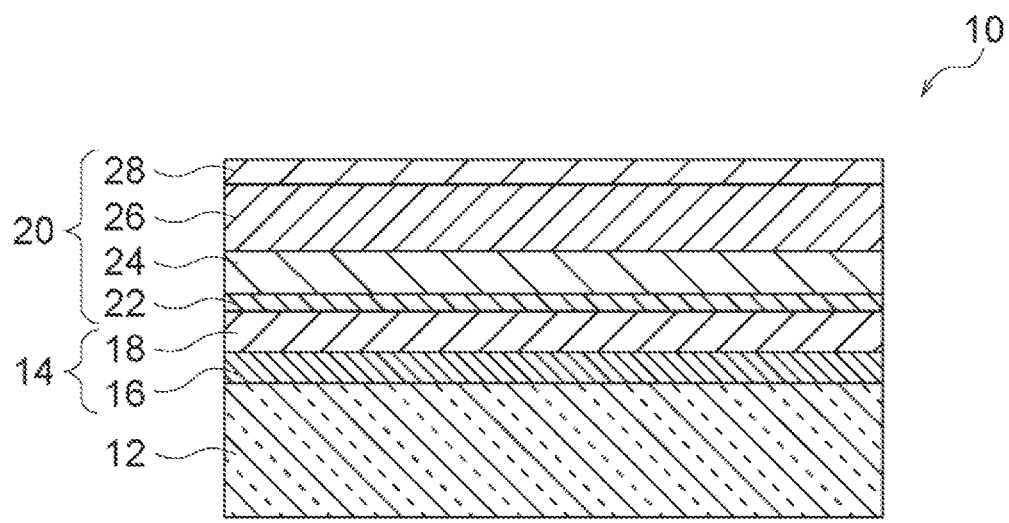
FIG. 2 is a schematic cross-sectional view showing another example of the carrier-attached metal foil of the present invention.

An example of a carrier-attached metal foil of the present invention is schematically shown in FIGS. 1 and 2. As shown in FIGS. 1 and 2, a carrier-attached metal foil 10 includes a career 12, a release functional layer 14, and a composite metal layer 20 in this order. The release functional layer 14 is provided on the career 12, and includes an adhesion layer 16 disposed closer to the career 12, and a release assistance layer 18 disposed farther from the career 12. The adhesion layer 16 has a thickness of more than 10 nm and less than 200 nm. The release assistance layer 18 has a thickness of 50 nm or more and 500 nm or less. The composite metal layer 20 is provided on the release functional layer 14, and includes a carbon layer 22 disposed closer to the release assistance layer 18, and a first metal layer 26 disposed farther from the release assistance layer 18. The first metal layer 26 is mainly composed of Au or Pt. As shown in FIG. 2, the composite metal layer 20 may further include a second metal layer 24 between the carbon layer 22 and the first metal layer 26. The composite metal layer 20 may further include a barrier layer 28 on the surface of the first metal layer 26 disposed farther from the carbon layer 22. The above-described various layers may be symmetrically provided in order in a vertical direction on both the surfaces of the career 12. Thus, the thickness of a layer which contributes to the release of the career 12 (that is, the adhesion layer 16 and the release assistance layer 18) is controlled in a specific range, and a metal layer mainly composed of Au or Pt (that is, the first metal layer 26) is employed, which makes it possible to provide the carrier-attached metal foil having excellent carrier-releasability and selective metal layer-etchability. This makes it possible to achieve a reduction in transmission loss and resistance in a semiconductor package (for example, a millimeter-wave antenna substrate) manufactured using the carrier-attached metal foil 10.

The material of the career 12 may be any one of glass, a ceramic, silicon, a resin, and a metal. Preferably, the career 12 is composed of glass, silicon, or a ceramic. The form of the career 12 may be any one of a sheet, a film, and a plate. The career 12 may be obtained by laminating sheets, films, plates and the like. For example, the career 12 may function as a rigid support such as a glass plate, a ceramic plate, a silicon wafer, or a metal plate, or may be a nonrigid support such as a metal foil or a resin film. Preferable examples of the metal constituting the career 12 include copper, titanium, nickel, stainless steel, and aluminum. Preferable examples of the ceramic include alumina, zirconia, silicon nitride, aluminum nitride, and other various fine ceramics. Preferable examples of the resin include polyethylene terephthalate (PET), polyethylene naphthalate (PEN), polyamide, polyimide, nylon, a liquid crystal polymer, polyether ether ketone (PEEK (registered trademark)), polyamideimide, polyether sulfone, polyphenylene sulfide, polytetrafluoroethylene (PTFE), and ethylene tetrafluoro ethylene (ETFE). From the viewpoint of preventing the warpage of a coreless support caused by heating when an electronic device is mounted, the resin is more preferably a material having a coefficient of thermal expansion (CTE) of less than 25 ppm/K (typically 1.0 ppm/K or more and 23 ppm/K or less). Examples of such a material include the above-described various resins (particularly low-thermal-expansion resins such as polyimide and a liquid crystal polymer), glass, silicon, and a ceramic. From the viewpoint of securing handleability and flatness during chip mounting, the career 12 preferably has Vickers hardness of 100 HV or more, and more preferably 150 HV or more and 2500 HV or less. In terms of the material satisfying these properties, the career 12 is preferably composed of glass, silicon, or a ceramic, more preferably glass or a ceramic, and particularly preferably glass. Examples of the career 12 composed of glass include a glass plate. The career 12 composed of glass has advantages such as lightweight, a low coefficient of thermal expansion, high insulating property, rigidity and a flat surface, so that the surface of the first metal layer 26 can be made extremely smooth. Furthermore, when the carrier 12 is composed of glass, it advantageously has surface flatness (coplanarity) favorable for forming a minute circuit and resistance against chemicals in desmear in a wiring manufacturing process and various plating processes, and can employ a chemical detachment method when the career 12 is released from the carrier-attached metal foil 10. Preferable examples of the glass constituting the career 12 include quartz glass, borosilicate glass, non-alkali glass, soda-lime glass, aminosilicate glass, and combinations thereof, more preferably non-alkali glass, soda-lime glass, and combinations thereof, and particularly preferably non-alkali glass. The non-alkali glass is substantially free of alkali metal and mainly contains silicon dioxide, aluminum oxide, boron oxide, an alkaline earth metal oxide such as calcium oxide or barium oxide, and further contains boric acid. The non-alkali glass has a low stable coefficient of thermal expansion of 3 ppm/K or more and 5 ppm/K or less in a wide temperature range from 0° C. to 350° C., so that the warpage of the glass in the heating process can be advantageously minimized. The thickness of the carrier 12 is preferably 100 μm or more and 2000 μm or less, more preferably 300 μm or more and 1800 μm or less, and still more preferably 400 μm or more and 1100 μm or less. The carrier having a thickness within such a range can achieve thinning of the wiring and a reduction in warpage during the mounting of electronic parts, while ensuring suitable strength which does not interfere with handling.

The surface of the career 12 disposed adjacent to the adhesion layer 16 preferably has an arithmetic average roughness Ra of 0.1 nm or more and 70 nm or less, more preferably 0.5 nm or more and 60 nm or less, still more preferably 1.0 nm or more and 50 nm or less, particularly preferably 1.5 nm or more and 40 nm or less, and most preferably 2.0 nm or more and 30 nm or less, as measured in accordance with JIS B 0601-2001 using a laser microscope. Thus, as the arithmetic average roughness of the surface of the career 12 is smaller, a desirably lower arithmetic average roughness Ra can be provided in the surface of the first metal layer 26 on the opposite side of the carbon layer 22 (the outer surface of the first metal layer 26). Thereby, in a wiring formed using the first metal layer 26, the carrier 12 is suitable for forming a wiring pattern having very fine line/space (L/S) of 13 μm or less/13 μm or less (for example, 12 μm/12 μm to 2 μm/2 μm).

The release functional layer 14 is a layer interposed between the career 12 and the carbon layer 22, and contributing to the stable release of the career 12. As described above, the release functional layer 14 includes the adhesion layer 16 disposed closer to the career 12, and the release assistance layer 18 disposed farther from the career 12. In this regard, the thicknesses of the adhesion layer 16 and the release assistance layer 18 are controlled in predetermined ranges, whereby desired release strength can be imparted to the carrier-attached metal foil 10. In terms of further improving the release function of the carrier-attached metal foil 10, the release functional layer 14 preferably includes at least one layer containing 80 atom % or more (preferably 85 atom % or more, and more preferably 90 atom % or more) of at least one selected from the group consisting of Cu, Ti, Ta, Cr, Ni, Al, Mo, Zn, W, TiN, and TaN as the adhesion layer 16 and/or the release assistance layer 18. The upper limit of the content of the above element or component in the release functional layer 14 is not particularly limited. The upper limit may be 100 atom %, but it is realistically 98 atom % or less. The content of the above element or component in the release functional layer 14 is a value measured by analysis with X-ray photoelectron spectroscopy (XPS).

In the carrier-attached metal foil 10, a ratio $T_2/T_1$ of a thickness $T_2$ of the release assistance layer 18 to a thickness $T_1$ of the adhesion layer 16 is preferably more than 1 and 20 or less, more preferably 1.5 or more and 15 or less, still more preferably 2 or more and 10 or less, and particularly preferably 2.5 or more and 6 or less. $T_2/T_1$ is set to be within the above range, whereby deterioration in the release function of the carbon layer 22 can be suppressed even when a heat treatment is performed in a wide temperature region such as 240° C. or higher and 340° C. or lower, for example. A mechanism in which the ratio of the thicknesses of the adhesion layer 16 and the release assistance layer 18 influences releasability is not necessarily clear, but this is considered to be because the diffusion behaviors of the elements constituting the layers of the carrier-attached metal foil 10 during heating are changed by changing the above ratio of the thicknesses.

The adhesion layer 16 is a layer interposed between the career 12 and the release assistance layer 18 to secure adhesion between the career 12 and the release assistance layer 18. Therefore, the adhesion layer 16 is preferably composed of a component having excellent adhesion to the career 12 compared with that to the release assistance layer 18. From this viewpoint, the adhesion layer 16 is preferably a layer composed of at least one selected from the group consisting of Cu, Ti, Ta, Cr, Ni, Al, Mo, Zn, W, TiN, and TaN, more preferably at least one selected from the group consisting of Ti, Ta, TiN, and TaN, still more preferably at least one selected from the group consisting of Ti and TiN, and particularly preferably Ti. In the adhesion layer 16, the content of the above metal or component measured by XPS is preferably 80 atom % or more, more preferably 85 atom % or more, and still more preferably 90 atom % or more. The upper limit of the content of the above metal or component in the adhesion layer 16 is not particularly limited. The upper limit may be 100 atom %, but it is realistically 98 atom % or less. The adhesion layer 16 may contain inevitable impurities derived from raw material components and deposition processes and the like. When the adhesion layer 16 is exposed to the atmosphere after the deposition of the adhesion layer 16, the presence of oxygen incorporated from the exposure is tolerated without particular limitation. In the adhesion layer 16, the content of the oxygen measured by XPS is typically 0 atom % or more and 5 atom % or less, more typically 0.05 atom % or more and 4 atom % or less, and still more typically 0.1 atom % or more and 3 atom % or less. The adhesion layer 16 may be manufactured by any method, but it is particularly preferably formed by a magnetron sputtering method using a target in terms of improved uniformity of film thickness distribution.

The thickness $T_1$ of the adhesion layer 16 is more than 10 nm and less than 200 nm, preferably 15 nm or more and 180 nm or less, more preferably 20 nm or more and 150 nm or less, still more preferably 30 nm or more and 120 nm or less, particularly preferably 40 nm or more and 100 nm or less, and most preferably 40 nm or more and 80 nm or less. Such a range makes it possible to effectively suppress deterioration in a release function (increase in release strength) caused by a heat treatment of vacuum pressing or the like when an insulating resin is laminated while securing moderate adhesion between the career 12 and the release assistance layer 18. The thickness of the adhesion layer 16 is a value measured by analyzing the cross section of the layer with transmission electron microscopy-energy dispersive X-ray spectroscopy (TEM-EDX).

In terms of controlling the release strength of the career 12 to a desired value, the release assistance layer 18 is preferably a layer composed of at least one selected from the group consisting of Cu, Ti, Ta, Cr, Ni, Al, Mo, Zn, W, TiN, and TaN, more preferably at least one selected from the group consisting of Cu, Ni, AlZn, and W, still more preferably at least one selected from the group consisting of Cu, Ni, and Al, and particularly preferably Cu. In the release assistance layer 18, the content of the above metal or component measured by XPS is preferably 80 atom % or more, more preferably 85 atom % or more, and still more preferably 90 atom % or more. The upper limit of the content of the above metal or component in the release assistance layer 18 is not particularly limited. The upper limit may be 100 atom %, but it is realistically 98 atom % or less. The release assistance layer 18 may contain inevitable impurities derived from raw material components and deposition processes and the like. When the release assistance layer 18 is exposed to the atmosphere after the deposition of the release assistance layer 18, the presence of oxygen incorporated from the exposure is tolerated without particular limitation. In the release assistance layer 18, the content of the oxygen measured by XPS is typically 0 atom % or more and 5 atom % or less, more typically 0.05 atom % or more and 4 atom % or less, and still more typically 0.1 atom % or more and 3 atom % or less. The release assistance layer 18 may be manufactured by any method, but it is particularly preferably formed by a magnetron sputtering method using a target in terms of improved uniformity of film thickness distribution.

The thickness $T_2$ of the release assistance layer 18 is 50 nm or more and 500 nm or less, preferably 100 nm or more and 450 nm or less, more preferably 150 nm or more and 400 nm or less, still more preferably 200 nm or more and 350 nm or less, and particularly preferably 250 nm or more and 300 nm or less. Such a range makes it possible to effectively suppress deterioration in a release function (increase in release strength) and to effectively suppress the occurrence of delamination (interlayer release of a substrate) in processes such as manufacture of a millimeter-wave antenna substrate. The thickness of the release assistance layer 18 is a value measured by analyzing the cross section of the layer with transmission electron microscopy-energy dispersive X-ray spectroscopy (TEM-EDX).

The composite metal layer 20 contains the carbon layer 22 disposed closer to the release assistance layer 18, and the first metal layer 26 disposed farther from the release assistance layer 18. The composite metal layer 20 may further contain the second metal layer 24 between the carbon layer 22 and the first metal layer 26. The composite metal layer 20 may further contain the barrier layer 28 on the surface of the first metal layer 26 disposed farther from the carbon layer 22. The thickness of the composite metal layer 20 is preferably 51 nm or more and 3220 nm or less, more preferably 100 nm or more and 2000 nm or less, and still more preferably 300 nm or more and 1000 nm or less. The thickness of the composite metal layer 20 is a value measured by analyzing the cross section of the layer with transmission electron microscopy-energy dispersive X-ray spectroscopy (TEM-EDX).

The carbon layer 22 is a layer mainly containing carbon, preferably a layer mainly composed of carbon or hydrocarbon, and more preferably a hard carbon film composed of amorphous carbon. Therefore, the carbon layer 22 preferably contains amorphous carbon. In the carbon layer 22, a carbon concentration measured by XPS is preferably 60 atom % or more, more preferably 70 atom % or more, still more preferably 80 atom % or more, and particularly preferably 85 atom % or more. The upper limit of the carbon concentration is not particularly limited. Although the upper limit is not particularly limited and may be 100 atom %, it is realistically 98 atom % or less. The carbon layer 22 may contain inevitable impurities (for example, oxygen, carbon, hydrogen and the like derived from an ambient environment such as an atmosphere). The deposition technique of the first metal layer 26, or the second metal layer 24 if present may cause metal atoms (for example, Au and Pt) to be incorporated in the carbon layer 22. Carbon has low interdiffusivity and reactivity with the release functional layer 14. Even if the carbon layer is subjected to press working or the like at a temperature higher than 300° C., the carbon layer prevents the formation of a metal bond by high temperature heating between the first metal layer 26 (the second metal layer 24 if present) and a bonded interface, which makes it possible to maintain a state where the career is easily removed by peeling. The carbon layer 22 is also preferably a layer formed by a vapor-phase method such as sputtering in terms of suppression of excessive impurities in amorphous carbon, and continuous productivity with the deposition of the above-described adhesion layer 16 and release assistance layer 18, and the like. The thickness of the carbon layer 22 is preferably 1 nm or more and 20 nm or less, and more preferably 1 nm or more and 10 nm or less. The thickness is a value measured by analyzing the cross section of the layer with transmission electron microscopy-energy dispersive X-ray spectroscopy (TEM-EDX).

The first metal layer 26 is a layer mainly composed of Au or Pt, and preferably a layer mainly composed of Au. These elements have higher chemical stability than that of other metal element such as Cu, which can desirably achieve a reduction in transmission loss and interconnection resistance in the millimeter-wave antenna substrate manufactured using the carrier-attached metal foil 10. In the millimeter-wave antenna substrate, the end part shape of a wiring is considered to be desirably maintained to guarantee the directivity of an antenna (that is, the angle of the edge portion of the wiring is close to 901. It can be said that since these metals have excellent selective etchability, the above end part shape is likely to be achieved during wiring formation (patterning) involving Au etching. The above metal constituting the first metal layer 26 may be a pure metal or an alloy. In the first metal layer 26, the content of the above metal (for example, Au) measured by XPS is preferably 60 atom % or more, more preferably 70 atom % or more, still more preferably 80 atom % or more, and particularly preferably 90 atom % or more. The upper limit of the content of the above metal (for example, Au) in the first metal layer 26 is not particularly limited. The upper limit may be 100 atom %, but it is typically 98 atom % or less. The metal constituting the first metal layer 26 may contain inevitable impurities derived from raw material components and deposition processes and the like. The first metal layer 26 is preferably a layer formed by a vapor-phase method such as sputtering. The first metal layer 26 preferably has a thickness of 50 nm or more and 2000 nm or less, more preferably 70 nm or more and 1500 nm or less, still more preferably 100 nm or more and 800 nm or less, and particularly preferably 200 nm or more and 500 nm or less. The thickness is a value measured by analyzing the cross section of the layer with transmission electron microscopy-energy dispersive X-ray spectroscopy (TEM-EDX).

The second metal layer 24 preferably imparts a desired function such as an etching stopper function or an antireflection function to the carrier-attached metal foil 10. Preferable examples of the metal constituting the second metal layer 24 include Ti, Ta, Ni, W, Cr, Pd, and combinations thereof. The metal is more preferably Ti, Ta, Ni, W, Cr, and combinations thereof, still more preferably Ti, Ta, Ni, and combinations thereof, particularly preferably Ti, Ta, and combinations thereof, and most preferably Ti. The above metal constituting the second metal layer 24 may be a pure metal or an alloy. In the second metal layer 24, the content of the above metal measured by XPS is preferably 50 atom % or more, more preferably 60 atom % or more, still more preferably 70 atom % or more, and particularly preferably 80 atom % or more. The upper limit of the content of the above metal in the second metal layer 24 is not particularly limited. The upper limit may be 100 atom %, but it is typically 98 atom % or less. These elements are not dissolved in a flash etching solution (for example, Au flash etching solution). As a result, the second metal layer 24 can exhibit excellent chemical resistance to the flash etching solution. Therefore, the second metal layer 24 is a layer which is less likely to be etched with the flash etching solution as compared with the first metal layer 26 to be described later. Therefore, the second metal layer 24 can function as an etching stopper layer. Since the above-described metal constituting the second metal layer 24 also has a function of preventing the reflection of light, the second metal layer 24 can also function as an antireflection layer for improving visibility in image inspection (for example, automatic image inspection (AOI)). The second metal layer 24 may contain nitrogen. The content of nitrogen measured by XPS is typically 0 atom % or more and 50 atom % or less, more typically 10 atom % or more, still more typically 20 atom % or more, and particularly typically 30 atom % or more. The metal constituting the second metal layer 24 may contain inevitable impurities derived from raw material components and deposition processes and the like. The second metal layer 24 is preferably a layer formed by a vapor-phase method such as sputtering. The thickness of the second metal layer 24 is preferably 50 nm or more and 1000 nm or less, more preferably 100 nm or more and 800 nm or less, still more preferably 200 nm or more and 500 nm or less, and particularly preferably 300 nm or more and 400 nm or less. The thickness is a value measured by analyzing the cross section of the layer with transmission electron microscopy-energy dispersive X-ray spectroscopy (TEM-EDX).

The barrier layer 28 is a layer for suppressing the formation of an intermetallic compound of the metal (that is, Au or Pt) constituting the first metal layer 26 and the metal (for example, Cu) constituting a wiring layer which may be formed on the first metal layer 26 (that is, the surface of the carrier-attached metal foil 10 on the opposite side of the career 12). In terms of more effectively suppressing the formation of the intermetallic compound, preferable examples of the metal constituting the barrier layer 28 include Ti, Ta, Ni, W, Cr, Pd, and combinations thereof, and more preferable examples thereof include Ta, Ni, W, Cr, and combinations thereof. The metal constituting the barrier layer 28 may be a pure metal or an alloy. In the barrier layer 28, the content of the metal measured by XPS is preferably 50 atom % or more, more preferably 60 atom % or more, still more preferably 70 atom % or more, and particularly preferably 80 atom % or more. The upper limit of the content of the metal in the barrier layer 28 is not particularly limited. The upper limit may be 100 atom %, but it is typically 98 atom % or less. The metal constituting the barrier layer 28 may contain inevitable impurities derived from raw material components and deposition processes and the like. The barrier layer 28 is preferably a layer formed by a vapor-phase method such as sputtering. The thickness of the barrier layer 28 is preferably 1 nm or more and 200 nm or less, more preferably 2 nm or more and 100 nm or less, still more preferably 3 nm or more and 70 nm or less, and particularly preferably 5 nm or more and 50 nm or less. The thickness is a value measured by analyzing the cross section of the layer with transmission electron microscopy-energy dispersive X-ray spectroscopy (TEM-EDX).

Each of the adhesion layer 16, the release assistance layer 18, the carbon layer 22, the second metal layer 24, the first metal layer 26, and the barrier layer 28 is preferably a physical vapor deposition (PVD) film, that is, a film formed by a physical vapor deposition (PVD) method, and more preferably a sputtering film, that is, a film formed by sputtering.

The entire thickness of the carrier-attached metal foil 10 is not particularly limited, but it is preferably 500 μm or more and 3000 μm or less, more preferably 700 μm or more and 2500 μm or less, still more preferably 900 μm or more and 2000 μm or less, and particularly preferably 1000 μm or more and 1700 μm or less. The size of the carrier-attached metal foil 10 is not particularly limited, but it is preferably 10 cm square or more, more preferably 20 cm square or more, and still more preferably 25 cm square or more. The upper limit of the size of the carrier-attached metal foil 10 is not particularly limited, but 1000 cm square may be an indication. The carrier-attached metal foil 10 can be independently handled by itself before and after the formation of the wiring.

Method for Manufacturing Carrier-Attached Metal Foil

The carrier-attached metal foil 10 of the present invention can be manufactured by providing a career 12, and forming an adhesion layer 16, a release assistance layer 18, and a carbon layer 22, optionally a second metal layer 24 and a first metal layer 26, optionally a barrier layer 28 on the career 12. Each of the adhesion layer 16, the release assistance layer 18, the carbon layer 22, the second metal layer 24 (if present), the first metal layer 26, and the barrier layer 28 (if present) is preferably deposited by a physical vapor deposition (PVD) method from the viewpoint of easily complying with fine pitch due to superthinning. Examples of the physical vapor deposition (PVD) method include a sputtering method, a vacuum deposition method, and an ion plating method. In terms of being capable of controlling the film thickness over a wide range of 0.05 nm to 5,000 nm and maintaining the uniform film thickness over a wide width or wide area, the sputtering method is most preferable. In particular, all of the adhesion layer 16, the release assistance layer 18, the carbon layer 22, the second metal layer 24 (if present), the first metal layer 26, and the barrier layer 28 (if present) are formed by the sputtering method, whereby the efficiency of manufacturing is remarkably improved. The deposition due to the physical vapor deposition (PVD) method may be performed under known conditions with any known vapor-phase deposition apparatus, and is not particularly limited. For example, when the sputtering method is employed, a sputtering system may be various known methods such as magnetron sputtering, a bipolar sputtering method, and a counter target sputtering method, but in terms of a high deposition rate and high productivity, the magnetron sputtering is preferable. The sputtering may be performed with any of direct current (DC) and high frequency (RF) power supplies. Regarding the target shape, a well-known plate target can be used, but from the viewpoint of the efficiency of use of the target, it is desirable to use a cylindrical target. Hereinafter, the deposition due to the physical vapor deposition (PVD) method (preferably the sputtering method) of each of the adhesion layer 16, the release assistance layer 18, the carbon layer 22, the second metal layer 24 (if present), the first metal layer 26, and the barrier layer 28 (if present) will be described.

The deposition of the adhesion layer 16 and the release assistance layer 18 due to the physical vapor deposition (PVD) method (preferably the sputtering method) is preferably performed by magnetron sputtering under a non-oxidizing atmosphere using a target composed of at least one metal selected from the group consisting of Cu, Ti, Ta, Cr, Ni, Al, Mo, Zn, and W in terms of being capable of improving uniformity in film thickness distribution. The purity of the target is preferably 99.9% by weight or more. As the gas used for sputtering, an inert gas such as an argon gas is preferably used. At this time, by performing sputtering in the argon gas (further a nitrogen gas as necessary) using a TiN target, a TaN target, a titanium target, or a tantalum target, the adhesion layer 16 and/or the release assistance layer 18 composed of TiN or TaN can be formed. The flow rate of the argon gas or the like may be appropriately determined depending on a sputtering chamber size and deposition conditions, and is not particularly limited. From the viewpoint of continuous deposition without operation failures such as abnormal discharge and plasma irradiation failure, the pressure during deposition is preferably within the range of 0.1 Pa or more and 20 Pa or less. The pressure range may be set by adjusting the electric power for deposition and the flow rate of the argon gas or the like depending on the structure and volume of a device, the exhaust capacity of a vacuum pump, and the rated capacity of a power supply for the deposition, and the like. In consideration of the uniformity in film thickness during deposition, and the productivity of the film and the like, the sputtering power may be appropriately set within the range of 0.05 W/cm$^2$ or more and 10.0 W/cm$^2$ or less per unit area of the target.

The deposition of the carbon layer 22 due to the physical vapor deposition (PVD) method (preferably the sputtering method) is preferably performed under an inert atmosphere such as argon using a carbon target. The carbon target is preferably composed of graphite, but it may contain inevitable impurities (for example, oxygen and carbon derived from the surrounding environment such as atmosphere). The purity of the carbon target is preferably 99.99% by weight or more, and more preferably 99.999% by weight or more. From the viewpoint of continuous deposition without operation failures such as abnormal discharge and plasma irradiation failure, the pressure during deposition is preferably within the range of 0.1 Pa or more and 20 Pa or less. The pressure range may be set by adjusting the electric power for deposition and the flow rate of the argon gas depending on the structure and volume of a device, the exhaust capacity of a vacuum pump, and the rated capacity of a power supply for the deposition, and the like. In consideration of the uniformity in film thickness during deposition, and the productivity of the film and the like, the sputtering power may be appropriately set within the range of 0.05 W/cm$^2$ or more and 10.0 W/cm$^2$ or less per unit area of the target.

The deposition of the second metal layer 24 and the barrier layer 28 due to the physical vapor deposition (PVD) method (preferably the sputtering method) is preferably performed by a magnetron sputtering method using a target composed of at least one metal selected from the group consisting of Ti, Ta, Ni, W, Cr, and Pd. The purity of the target is preferably 99.9% or more. In particular, the deposition of the second metal layer 24 and the barrier layer 28 due to the magnetron sputtering method is preferably performed at a pressure of 0.1 Pa or more and 20 Pa or less under an inert gas atmosphere such as argon. The sputtering pressure is more preferably 0.2 Pa or more and 15 Pa or less, and still more preferably 0.3 Pa or more and 10 Pa or less. The pressure range may be controlled by adjusting the electric power for deposition and the flow rate of the argon gas depending on the structure and volume of a device, the exhaust capacity of a vacuum pump, and the rated capacity of a power supply for the deposition, and the like. The flow rate of the argon gas may be appropriately determined depending on a sputtering chamber size and deposition conditions, and is not particularly limited. In consideration of the uniformity in film thickness during deposition, and the productivity of the film and the like, the sputtering power may be appropriately set within the range of 1.0 W/cm$^2$ or more and 15.0 W/cm$^2$ or less per unit area of the target. The carrier temperature is preferably kept constant during deposition in terms of ease of achieving stable film characteristics (for example, film resistance and crystal size). The carrier temperature during deposition is preferably adjusted within the range of 25° C. or higher and 300° C. or lower, more preferably within the range of 40° C. or higher and 200° C. or lower, and still more preferably within the range of 50° C. or higher and 150° C. or lower.

The deposition of the first metal layer 26 due to the physical vapor deposition (PVD) method (preferably the sputtering method) is preferably performed under an inert atmosphere such as argon using a target composed of at least one metal selected from the group consisting of Au and Pt. The target is preferably composed of a metal or an alloy, but it may contain inevitable impurities. The purity of the target is preferably 99.9% or more, more preferably 99.99% or more, and still more preferably 99.999% or more. A cooling mechanism for the stage may be provided during sputtering to avoid a temperature rise during the vapor-phase deposition of the first metal layer 26. From the viewpoint of stable deposition without operation failures such as abnormal discharge and plasma irradiation failure, the pressure during deposition is preferably within the range of 0.1 Pa or more and 20 Pa or less. The pressure range may be set by adjusting the electric power for deposition and the flow rate of the argon gas depending on the structure and volume of a device, the exhaust capacity of a vacuum pump, and the rated capacity of a power supply for the deposition, and the like. In consideration of the uniformity in film thickness during deposition, and the productivity of the film and the like, the sputtering power may be appropriately set within the range of 0.05 W/cm$^2$ or more and 10.0 W/cm$^2$ or less per unit area of the target.

Method for Manufacturing Millimeter-Wave Antenna Substrate

The carrier-attached metal foil 10 of the present invention is preferably used for manufacture of a millimeter-wave antenna substrate. That is, a preferable aspect of the present invention provides a method for manufacturing a millimeter-wave antenna substrate including manufacturing the millimeter-wave antenna substrate using the above-described carrier-attached metal foil 10, or the millimeter-wave antenna substrate obtained by using the above-described carrier-attached metal foil 10. The use of the carrier-attached metal foil 10 of the present invention makes it possible to provide the millimeter-wave antenna substrate having transmission loss and resistance desirably reduced, as described above. Hereinafter, a preferable example of the method for manufacturing the millimeter-wave antenna substrate using the carrier-attached metal foil 10 of the present invention will be described. The method includes (1) laminating an Insulating layer and a wiring layer on a carrier-attached metal foil to form a circuit, (2) mounting an IC chip, (3) releasing a career, (4) etching away a second metal layer (if present), and (5) forming an antenna by patterning.

(1) Formation of Circuit

Figure 3:
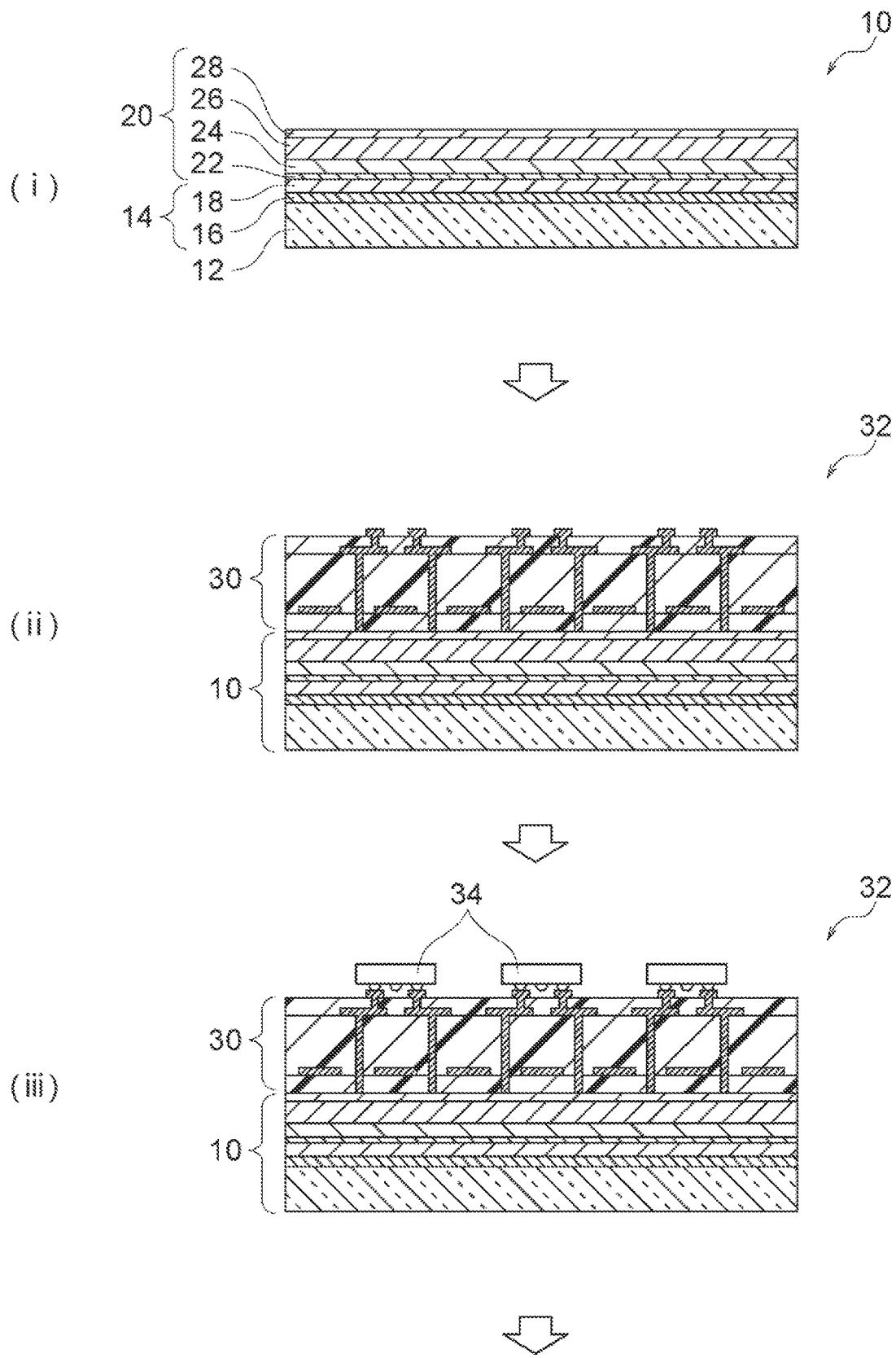
FIG. 3 is a process flow chart showing an example of a method for manufacturing a millimeter-wave antenna substrate of the present invention, and showing a first half of the process (steps (i) to (iii)).

A carrier-attached metal foil 10 is provided (FIG. 3 (i)), and an insulating layer and a wiring layer are laminated on the surface of a first metal layer 26 of the carrier-attached metal foil 10 (a barrier layer 28 if present) to obtain a laminated body 32 in which a circuit substrate 30 is formed (FIG. 3 (ii)). A formation technique of the circuit substrate 30 is not particularly limited, and a desired insulating layer and wiring layer can be formed by a known coreless build-up method as shown in Patent Literature 1, for example. In order to reduce interference in the millimeter-wave antenna substrate, the thickness of an insulating resin (insulating layer) in the circuit substrate 30 is preferably 100 μm or more, and more preferably 200 μm or more and 500 μm or less. Preferable examples of the insulating resin include an epoxy resin, a cyanate resin, a bismaleimide triazine resin (BT resin), a polyphenylene ether resin, and a phenol resin. For example, ABF-GXT31 manufactured by Ajinomoto-Fine-Techno Co., Inc. can be preferably used as the insulating resin. The insulating layer may contain filler particles composed of various inorganic particles such as silica and alumina particles from the viewpoint of improving the insulating property of the insulating layer. The insulating layer may be composed of a plurality of layers.

(2) Mounting of IC Chip

An IC chip 34 for millimeter waves is mounted on the outer surface of the circuit substrate 30 (that is, the surface on the opposite side of the carrier-attached metal foil 10) (FIG. 3 (iii)). Herein, the "millimeter wave" refers to a radio wave of a frequency of 24 GHz or more and 300 GHz or less. Herein, an "IC (integrated circuit)" broadly encompasses various ICs such as a central processing unit (CPU), a digital signal processor (DSP), a memory, a power management IC (PMIC), and an RFIC (high frequency integrated circuit (for example, global positioning system (GPS)). Examples of a chip mounting method include a flip chip mounting method and a die-bonding method. The flip chip mounting method is a method in which a mounting pad of the IC chip 34, and a wiring layer of the circuit substrate 30 are joined to each other. On the mounting pad, a pillar-shaped electrode (pillar) and a solder bump and the like may be formed, and a non-conductive film (NCF) or the like which is a sealing resin film may be attached to the surface of the circuit substrate 30 before mounting. The joining is preferably performed by using a low-melting-point metal such as a solder, but an anisotropic conductive film or the like may be used. A die-bonding adhesion method is a method in which the surface of the IC chip 34 on the opposite side of a mounting pad surface is adhered to the wiring layer. It is preferable to use a paste or a film which is made of a resin composition containing a thermoset resin and a thermally conductive inorganic filler for the adhesion. The IC chip 34 is preferably resin-sealed by using a known sealing agent such as an epoxy resin.

(3) Release of Career

Figure 4:
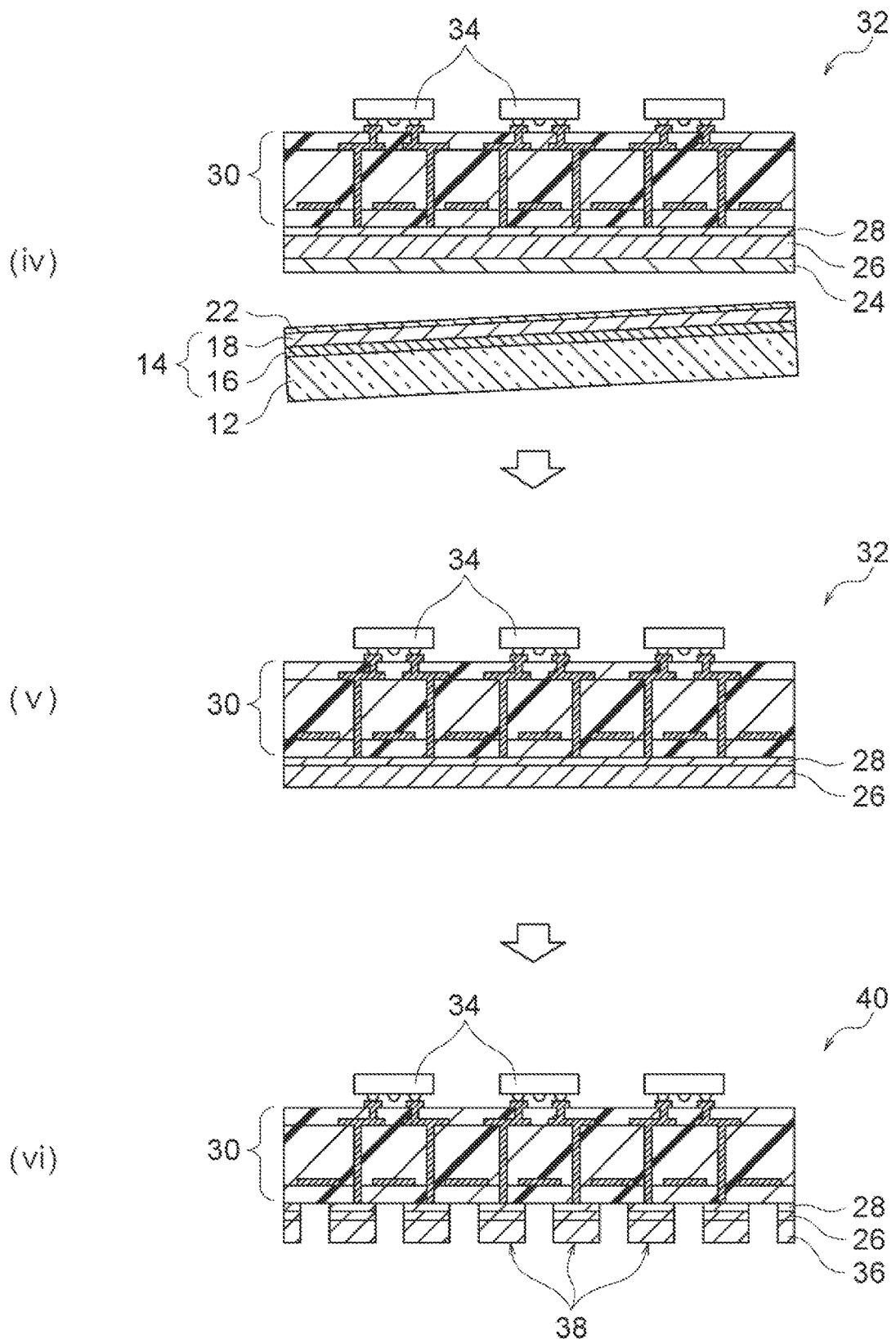
FIG. 4 is a process flow chart showing an example of the method for manufacturing a millimeter-wave antenna substrate of the present invention, and showing a process following FIG. 3 (steps (iv) to (vi)).

From the laminated body 32 on which the IC chip 34 is mounted, the career 12 is released together with the release functional layer 14 at the position of the carbon layer 22 (FIG. 4 (iv)). In such a manner, the second metal layer 24 (if present) is exposed to the outer surface of the laminated body 32. When a thick insulating resin (for example, a thickness of 200 μm or more) during the above-described formation of the circuit substrate 30 is used, the carrier-attached metal foil is apt to be subjected to a stress from the insulating resin, which may cause unstable release strength. In this regard, as described above, in the carrier-attached metal foil 10 of the present invention, the thicknesses of the adhesion layer 16 and the release assistance layer 18 are controlled within predetermined ranges, which makes it possible to stably release the career 12.

(4) Etching Away Second Metal Layer

When the second metal layer 24 is present, the second metal layer 24 is etched away from the laminated body 32 using a commercially available etching solution or the like to expose the first metal layer 26 to the outer surface of the laminated body 32 (FIG. 4 (v)). The second metal layer 24 may be etched based on a known technique, and is not particularly limited.

(5) Formation of Antenna

By patterning the surface of the first metal layer 26 of the laminated body 32 (the surface on the opposite side of the IC chip 34), a millimeter-wave antenna substrate 40 in which an antenna 38 is formed is obtained (FIG. 4 (vi)). As an example of the formation technique of the antenna 38, first, a photosensitive dry film is attached to the surface of the first metal layer 26 of the laminated body 32, followed by exposing and developing to form a photoresist layer (not shown) having a predetermined pattern. The exposed surface of the first metal layer 26 (that is, the portion which is not masked by the photoresist layer) is subjected to electroless plating (for example, electroless Au plating) to form an electroless plating layer 36, and the photoresist layer is then stripped. In such a manner, the first metal layer 26, the barrier layer 28 if present, and the electroless plating layer 36 remain in the form of a wiring pattern to form the antenna 38. Meanwhile, the first metal layer 26 is exposed in the portion in which no wiring pattern is formed. Then, an unnecessary portion of the exposed first metal layer 26 and an unnecessary portion of the barrier layer 28 if present are removed with an etching solution, whereby the millimeter-wave antenna substrate 40 in which the antenna 38 is formed can be obtained. When a millimeter-wave antenna substrate is produced by using a conventional carrier-attached copper foil, it is necessary to perform electroless Ni plating or the like before the formation of the electroless plating layer, in order to secure adhesion between the copper layer and the electroless plating layer (for example, the Au layer), which may cause high resistance. Meanwhile, according to the carrier-attached metal foil 10 of the present invention, the first metal layer 26 is composed of Au or the like, which eliminates the use of the electroless Ni plating. As a result, much lower resistance in the millimeter-wave antenna substrate can be achieved.

Figure 5:
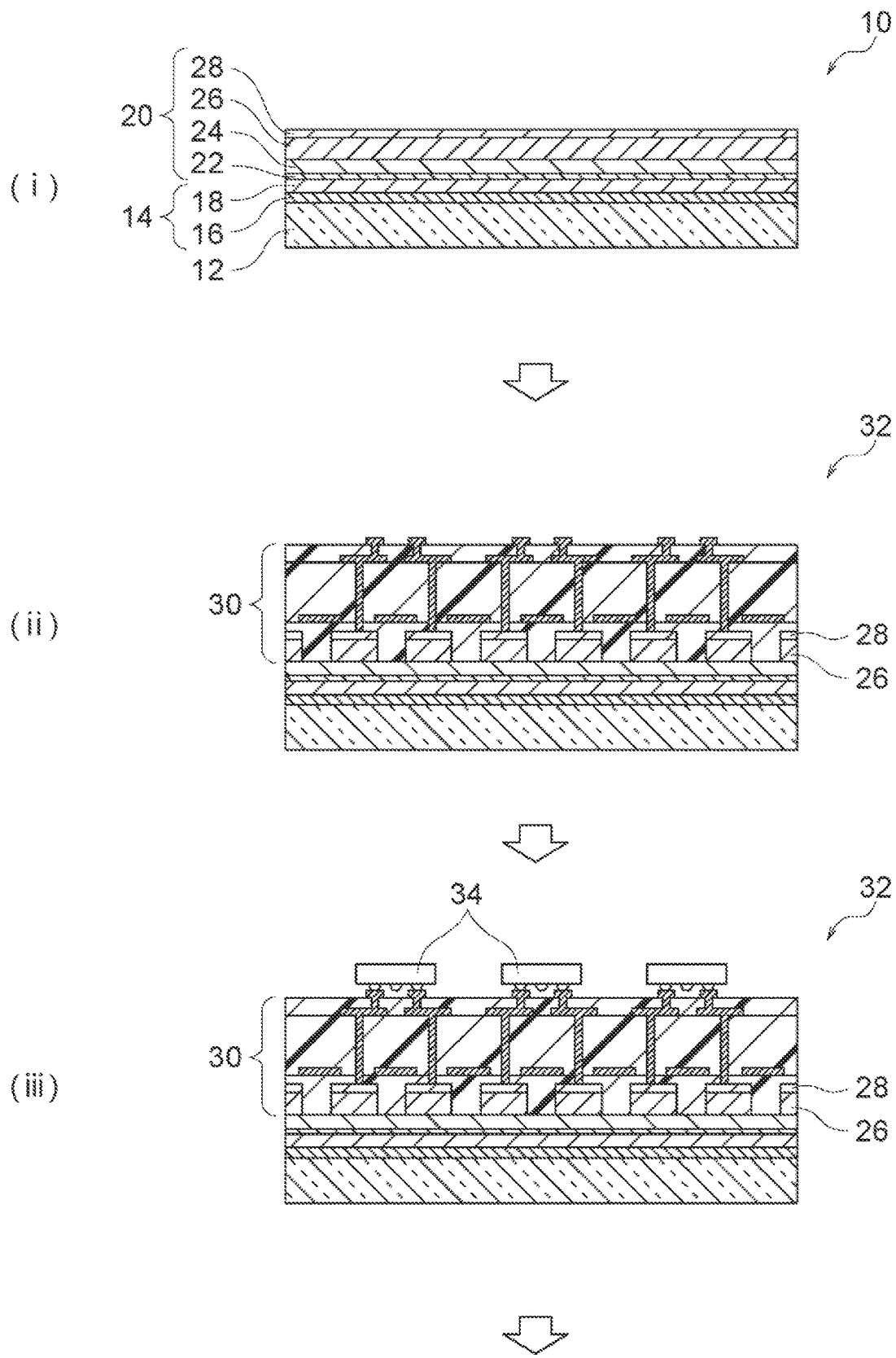
FIG. 5 is a process flow chart showing another example of the method for manufacturing a millimeter-wave antenna substrate of the present invention, and showing a first half of the process (steps (i) to (iii)).
Figure 6:
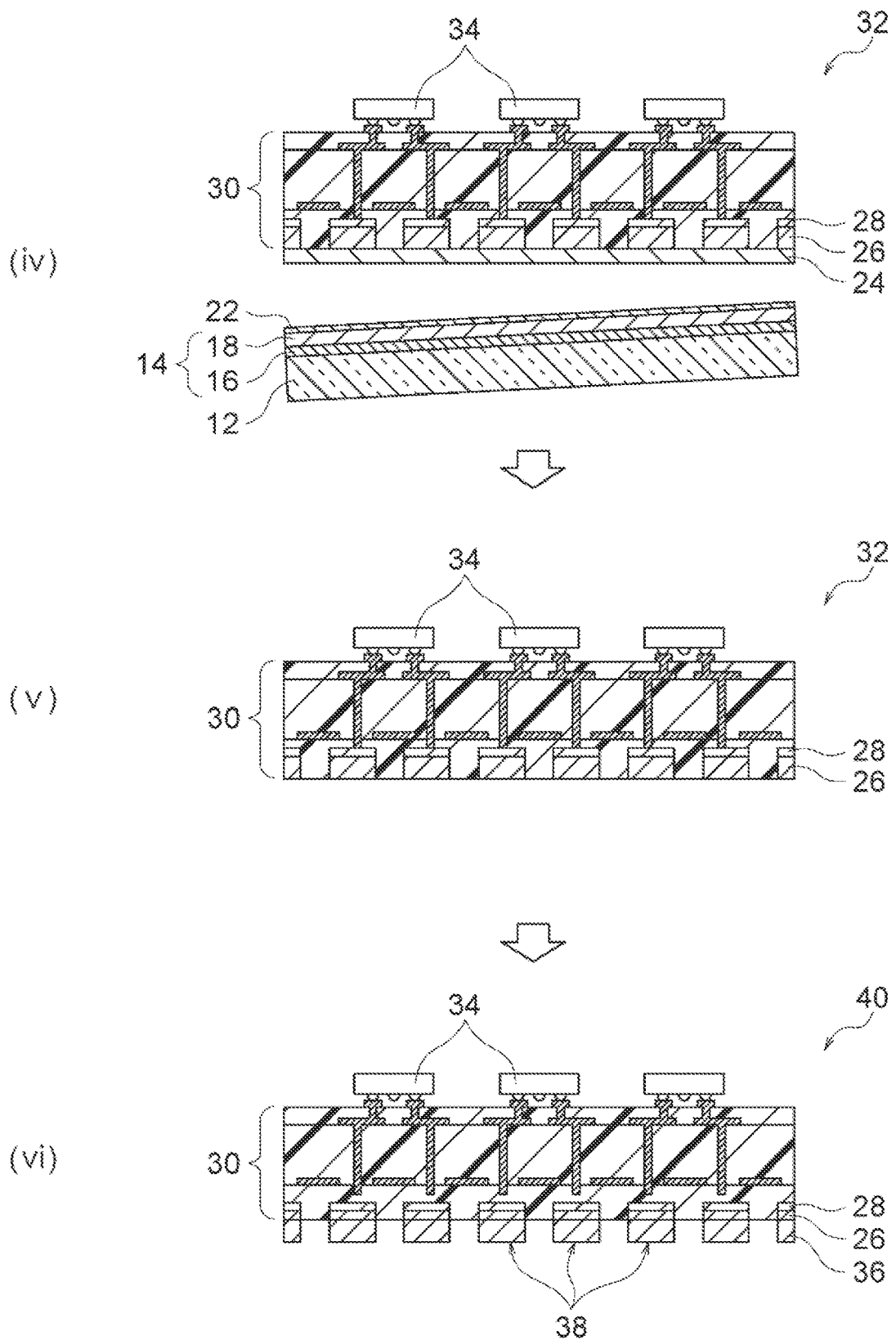
FIG. 6 is a process flow chart showing another example of the method for manufacturing a millimeter-wave antenna substrate of the present invention, and showing a process following FIG. 5 (steps (iv) to (vi)).

A part of or the whole of the antenna 38 may be in a form of an embedded circuit. That is, the first metal layer 26 and the barrier layer 28 if present may be patterned before the lamination of the resin in the above (1). In such a manner, the laminated body 32 in which a part of the wiring layer is embedded in the form of the embedded circuit in the surface can be obtained (FIG. 5 (ii)). When the barrier layer 28 is not present, a Ni thin film or the like is preferably formed on the surface of the first metal layer 26 by sputtering or the like before the above patterning is performed. Then, by subjecting the laminated body 32 to the various steps of the above (2) to (5), the millimeter-wave antenna substrate 40 in which a part of or the whole of the antenna 38 is the embedded circuit can be obtained (see FIGS. 5 and 6). When the millimeter-wave antenna substrate 40 is produced in the procedure, in the antenna formation step of the above (5), it is desirable to perform the electroless plating (for example, the electroless Au plating) before forming the photoresist layer, to form a seed layer.

EXAMPLES

The present invention will be more specifically described by the following Examples.

Example 1

On a career 12, an adhesion layer 16, a release assistance layer 18, a carbon layer 22, a second metal layer 24, and a first metal layer 26 were deposited in this order, to manufacture a carrier-attached metal foil 10. Specific procedures will be described below.
(1) Preparation of Career
A glass sheet having a thickness of 1.1 mm (material: soda-lime glass, arithmetic average roughness Ra: 0.6 nm) was prepared as the career 12.
(2) Formation of Adhesion Layer
On the career 12, a titanium layer a thickness of 50 nm was formed as the adhesion layer 16 by a sputtering method. The sputtering was performed under the following conditions using the following apparatus.
  Apparatus: single wafer type magnetron sputtering apparatus (MLS 464, manufactured by Canon Tokki Corporation)
  Target: titanium target (purity: 99.999%) having a diameter of 8 inches (203.2 mm)
  Ultimate vacuum: less than $1\times10^{-4}$ Pa
  Sputtering pressure: 0.35 Pa
  Sputtering power: 1000 W (3.1 W/cm$^2$)
  Temperature during deposition: 40° C.
(3) Formation of Release Assistance Layer
A copper layer having a thickness of 200 nm was formed as the release assistance layer 18 on the surface of the adhesion layer 16 on the opposite side of the career 12 by a sputtering method. The sputtering was performed under the following conditions using the following apparatus.
  Apparatus: single wafer type DC sputtering apparatus (MLS 464, manufactured by Canon Tokki Corporation)
  Target: copper target (purity: 99.98%) having a diameter of 8 inches (203.2 mm)
  Ultimate vacuum: less than $1\times10^{-4}$ Pa
  Gas: argon gas (flow rate: 100 sccm)
  Sputtering pressure: 0.35 Pa
  Sputtering power: 1000 W (6.2 W/cm$^2$)
  Temperature during deposition: 40° C.
(4) Formation of Carbon Layer
An amorphous carbon layer having a thickness of 6 nm was formed as the carbon layer 22 on the surface of the release assistance layer 18 on the opposite side of the adhesion layer 16 by a sputtering method. The sputtering was performed under the following conditions using the following apparatus.
  Apparatus: single wafer type DC sputtering apparatus (MLS 464, manufactured by Canon Tokki Corporation)
  Target: carbon target (purity: 99.999%) having a diameter of 8 inches (203.2 mm)
  Ultimate vacuum: less than $1\times10^{-4}$ Pa
  Gas: argon gas (flow rate: 100 sccm)
  Sputtering pressure: 0.35 Pa
  Sputtering power: 250 W (0.7 W/cm$^2$)
  Temperature during deposition: 40° C.
(5) Formation of Second Metal Layer
A titanium layer having a thickness of 100 nm was formed as the second metal layer 24 on the surface of the carbon layer 22 on the opposite side of the release assistance layer 18 by a sputtering method under the following conditions using the following apparatus.
  Apparatus: single wafer type DC sputtering apparatus (MLS 464, manufactured by Canon Tokki Corporation)
  Target: titanium target (purity: 99.999%) having a diameter of 8 inches (203.2 mm)
  Carrier gas: argon gas (flow rate: 100 sccm)
  Ultimate vacuum: less than $1\times10^{-4}$ Pa
  Sputtering pressure: 0.35 Pa
  Sputtering power: 1000 W (3.1 W/cm$^2$)
(6) Formation of First Metal Layer
An Au layer having a thickness of 300 nm was formed as the first metal layer 26 on the surface of the second metal layer 24 on the opposite side of the release assistance layer 18 by a sputtering method. The sputtering was performed under the following conditions using the following apparatus.
  Apparatus: single wafer type DC sputtering apparatus (MLS 464, manufactured by Canon Tokki Corporation)
  Target: gold target (purity: 99.99%) having a diameter of 8 inches (203.2 mm)
  Ultimate vacuum: less than $1\times10^{-4}$ Pa
  Gas: argon gas (flow rate: 100 sccm)
  Sputtering pressure: 0.35 Pa
  Sputtering power: 1000 W (3.1 W/cm$^2$)
  Temperature during deposition: 40° C.

Example 2

A carrier-attached metal foil was produced in the same manner as in Example 1 except that the first metal layer 26 was formed in the above (6), and a barrier layer 28 was then formed as follows.
(7) Formation of Barrier Layer
A nickel layer having a thickness of 30 nm was formed as the barrier layer on the surface of the first metal layer 26 on the opposite side of the second metal layer 24 by a sputtering method. The sputtering was performed under the following conditions using the following apparatus.
  Apparatus: single wafer type DC sputtering apparatus (MLS 464, manufactured by Canon Tokki Corporation)
  Target: nickel target (purity: 99.9%) having a diameter of 8 inches (203.2 mm)
  Carrier gas: argon gas (flow rate: 100 sccm)
  Ultimate vacuum: less than $1\times10^{-4}$ Pa
  Sputtering pressure: 0.35 Pa
  Sputtering power: 1000 W (3.1 W/cm$^2$)

Example 3 (Comparison)

A carrier-attached metal foil was produced in the same manner as in Example 1 except that a sputtering copper target (purity: 99.98%) was used to form a copper layer as the first metal layer 26 in place of the Au layer.

Example 4

A carrier-attached metal foil was produced in the same manner as in Example 2 except that a sputtering tantalum target (purity: 99.9%) was used to form a tantalum layer as the second metal layer 24 and the barrier layer 28 in place of the titanium layer or the nickel layer.

Example 5

A carrier-attached metal foil was produced in the same manner as in Example 2 except that a sputtering nickel target (purity: 99.9%) was used to form a nickel layer as the second metal layer 24 in place of the titanium layer.

Example 6

A carrier-attached metal foil was produced in the same manner as in Example 2 except that a sputtering tungsten target (purity: 99.9%) was used to form a tungsten layer as the second metal layer 24 and the barrier layer 28 in place of the titanium layer or the nickel layer.

Example 7

A carrier-attached metal foil was produced in the same manner as in Example 2 except that a sputtering chromium target (purity: 99.9%) was used to form a chromium layer as the second metal layer 24 and the barrier layer 28 in place of the titanium layer or the nickel layer.

Example 8

A carrier-attached metal foil was produced in the same manner as in Example 2 except that a sputtering palladium target (purity: 99.9%) was used to form a palladium layer as the second metal layer 24 and the barrier layer 28 in place of the titanium layer or the nickel layer.

Example 9

A carrier-attached metal foil was produced in the same manner as in Example 2 except the thickness of the release assistance layer 18 was set to 300 nm.

Example 10

A carrier-attached metal foil was produced in the same manner as in Example 2 except the thickness of the release assistance layer 18 was set to 100 nm.

Example 11

A carrier-attached metal foil was produced in the same manner as in Example 2 except that the thickness of the adhesion layer 16 was set to 100 nm, and the thickness of the release assistance layer 18 was set to 50 nm.

Example 12

A carrier-attached metal foil was produced in the same manner as in Example 2 except that the thickness of the adhesion layer 16 was set to 150 nm, and the thickness of the release assistance layer 18 was set to 500 nm.

Example 13 (Comparison)

A carrier-attached metal foil was produced in the same manner as in Example 2 except that the thickness of the adhesion layer 16 was set to 10 nm, and the thickness of the release assistance layer 18 was set to 30 nm.

Example 14 (Comparison)

A carrier-attached metal foil was produced in the same manner as in Example 2 except that the thickness of the adhesion layer 16 was set to 200 nm, and the thickness of the release assistance layer 18 was set to 600 nm.

Evaluations

The carrier-attached metal foil 10 of each of Examples 1 to 14 was subjected to various evaluations as shown later. The evaluation results were as shown in Table 1. The marks "-" described in Table 1 mean that the carrier-attached metal foils are not subjected to the foregoing evaluations.

<Evaluation 1: Releasability>

The release strength of the carrier-attached metal foil 10 was measured as follows. First, the surface of the first metal layer 26 of the carrier-attached metal foil 10 (the barrier layer 28 if present) was subjected to panel electrodeposited copper plating having a thickness of 18 μm to form a plating-up layer. Here, in Example 1, electroless Ni plating was performed before the panel electrodeposited copper plating for the purpose of guaranteeing adhesiveness between Au and Cu. The carrier-attached metal foil 10 in which the plating-up layer was formed was heat-treated by solder reflow (kept at 260° C. or higher for 2 minutes), assuming the mounting of electronic parts, and then spontaneously cooled to room temperature to obtain a copper-clad laminate. The release strength (gf/cm) of the obtained copper-clad laminate was measured by releasing the composite metal layer 20 integrated with the plating-up layer in accordance with JIS C 6481-1996. At this time, a measurement width was set to 50 mm and a measurement length was set to 20 mm. The obtained release strength (average value) was rated and evaluated based on the following criteria.

Evaluation A: release strength of 3 gf/cm or more and 10 gf/cm or less

Evaluation B: release strength of 1 gf/cm or more and 30 gf/cm or less (excluding ones corresponding to Evaluation A)

Evaluation C: release strength of less than 1 gf/cm or more than 30 gf/cm and less than 50 gf/cm Evaluation D: release strength of 50 gf/cm or more <Evaluation 2-1: Transmission Loss (Patterning after Lamination of Resin)>

Figure 7:
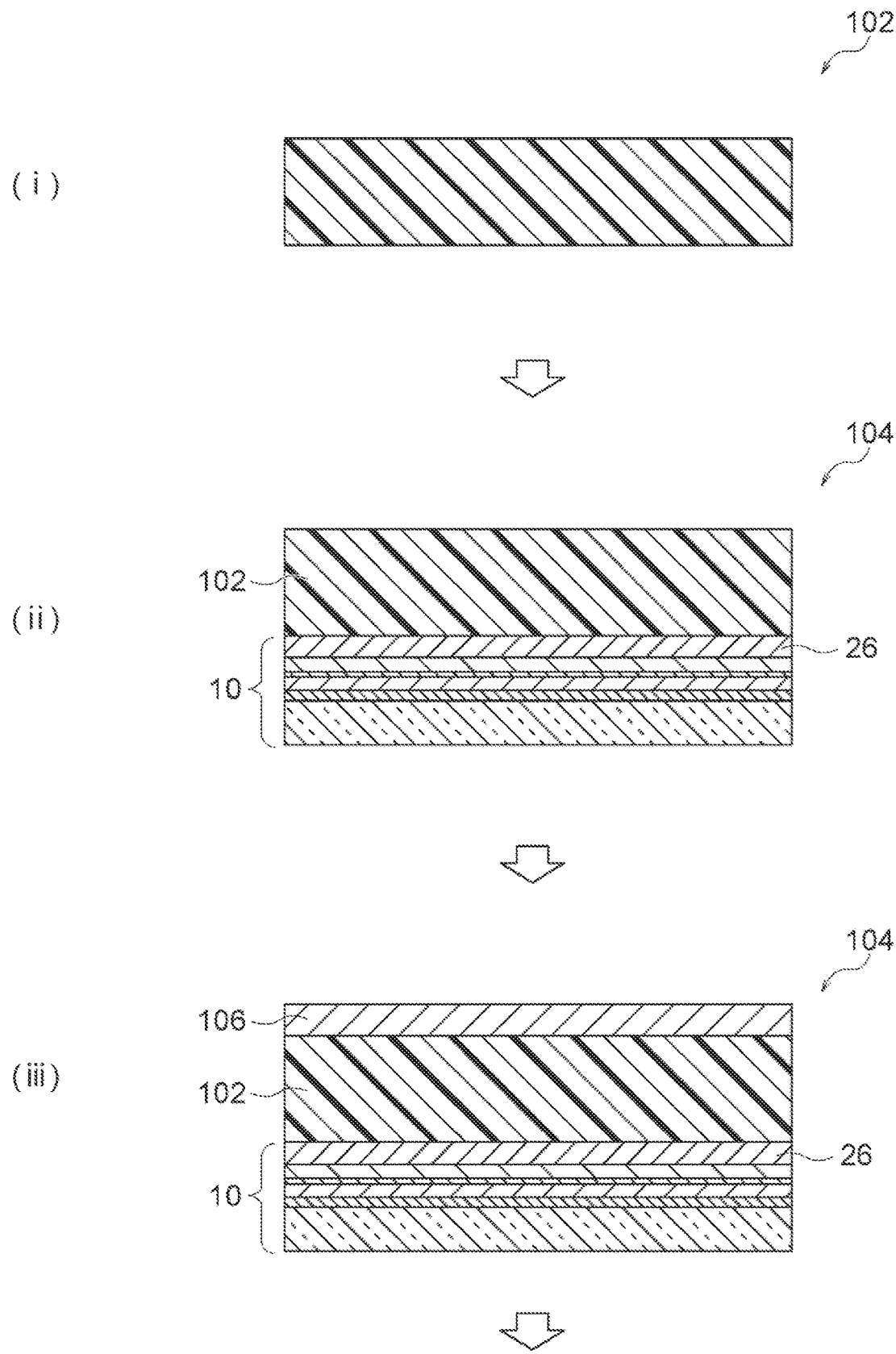
FIG. 7 is a process flow chart showing the production procedure of a sample for transmission loss measurement in Evaluation 2-1 of Examples, and showing a first half of the process (steps (i) to (iii)).
Figure 8:
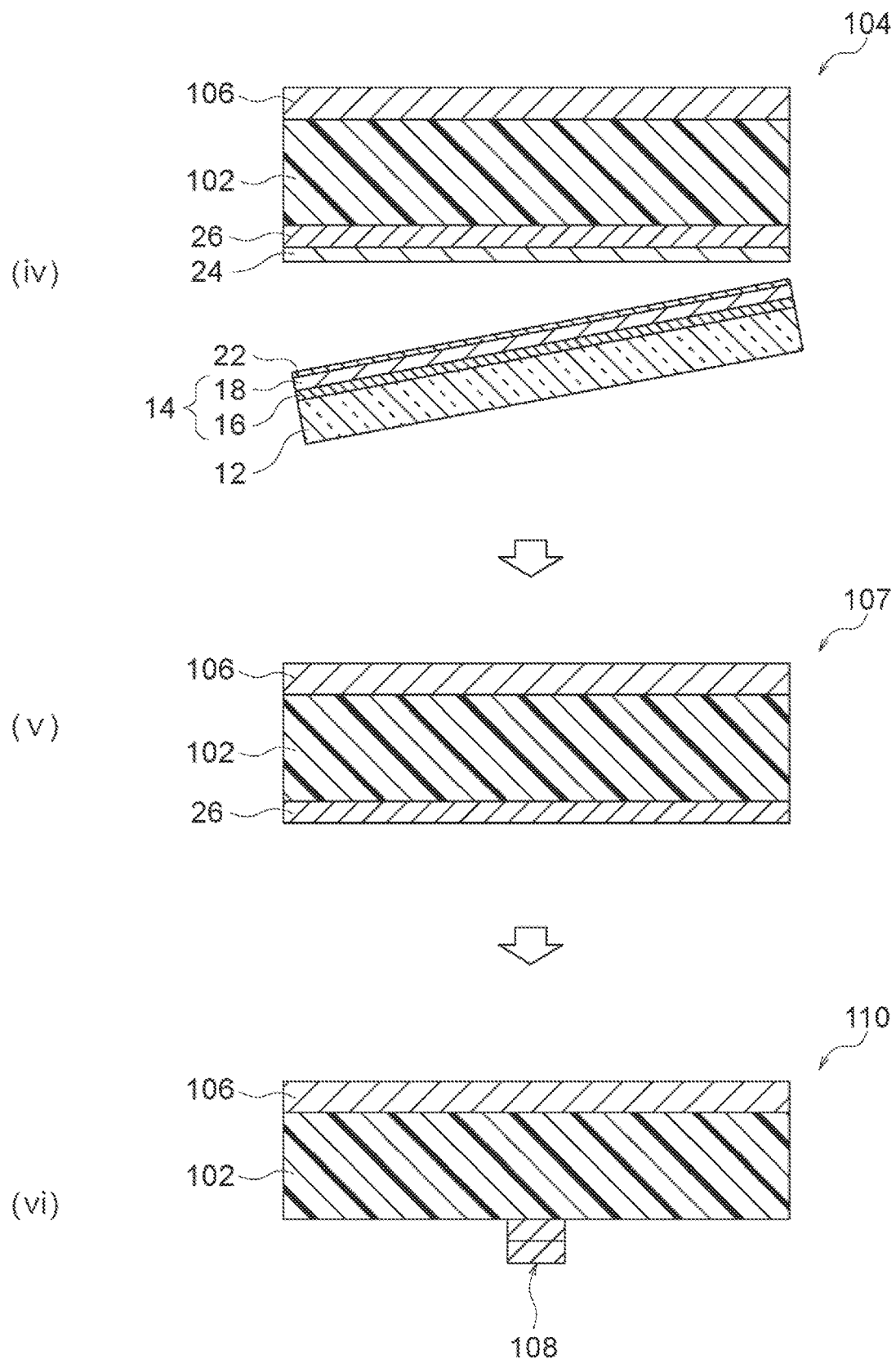
FIG. 8 is a process flow chart showing the production procedure of a sample for transmission loss measurement in Evaluation 2-1 of Examples, and showing a process following FIG. 7 (steps (iv) to (vi)).

In terms of each of the carrier-attached metal foils 10 of Examples 1 to 8, a sample 110 for transmission loss measurement was produced in procedures shown in FIGS. 7 and 8, and transmission loss of the sample 110 was measured and evaluated.

First, six insulating resin films (ABF-GXT31, manufactured by Ajinomoto-Fine-Techno co., inc., relative permittivity: 3.4) having a thickness of 35 μm were laminated to obtain an insulating resin substrate 102 (FIG. 7 (i)). The first metal layer 26 (the barrier layer 28 if present) of the carrier-attached metal foil 10 was joined to one surface of the insulating resin substrate 102, followed by laminating under the conditions of a temperature of 100° C., a pressure of 0.7 MPa, and a pressing time of 90 seconds using a vacuum pressing machine, to obtain a metal-clad laminate 104 including the insulating resin substrate 102 having a thickness h of about 200 μm (FIG. 7 (ii)).

Next, a Cu foil having a thickness of 18 μm as a ground layer 106 was joined to the surface of the insulating resin substrate 102 of the metal-clad laminate 104 (the opposite side of the carrier-attached metal foil 10) by vacuum pressing (FIG. 7 (iii)). The vacuum pressing was performed under the conditions of a temperature of 100° C., a pressure of 0.7 MPa, and a pressing time of 120 seconds. Then, the insulating resin substrate 102 was cured. The insulating resin substrate 102 was temporarily cured at 170° C. for 30 minutes, and then fully cured at 200° C. for 60 minutes.

Then, the career 12 was released together with the release functional layer 14 at the position of the carbon layer 22 from the metal-clad laminate 104 (FIG. 8 (iv)). The first metal layer 26 was exposed by removing the second metal layer 24 exposed to one surface side of the metal-clad laminate 104 by etching. Thus, a double-sided metal-clad laminate 107 was obtained, in which the first metal layer 26, the insulating resin substrate 102, and the ground layer 106 were laminated in this order (FIG. 8 (v)). The surface of the first metal layer 26 of the obtained double-sided metal-clad laminate 107 was rinsed with water and dried.

Figure 9:
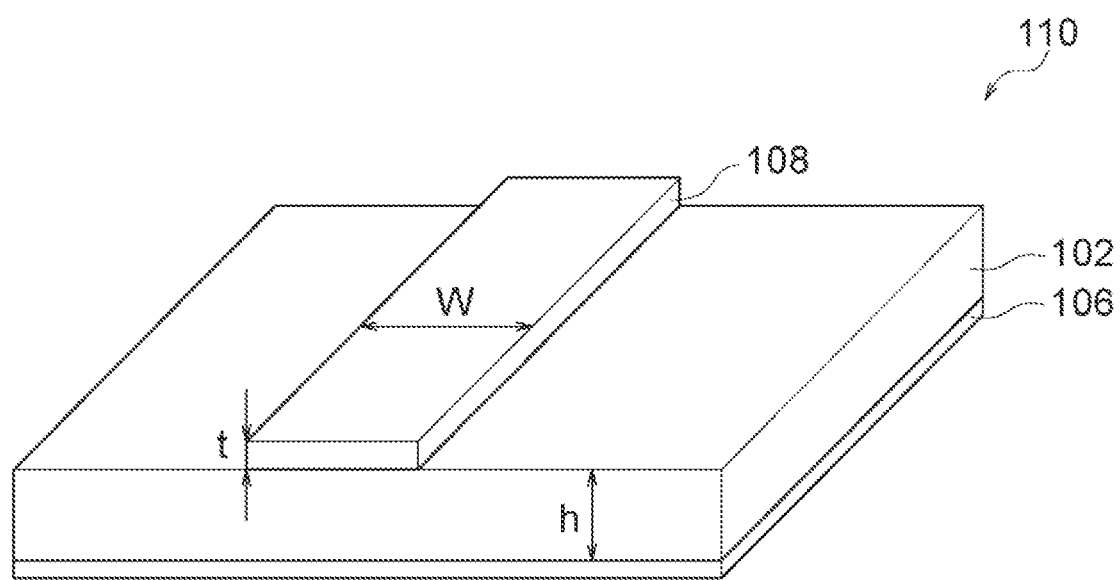
FIG. 9 is a perspective view of the sample for transmission loss measurement shown in FIG. 8 (vi).

A photosensitive dry film (not shown) was attached to the surface of the first metal layer 26 of the double-sided metal-clad laminate 107, exposed, developed, and subjected to electroless Au plating. The developing was performed by a shower method at 25° C. for 2 minutes using a 1.0% by weight aqueous sodium carbonate solution as a developing solution. The dry film (photoresist layer) was stripped, and an unnecessary portion of the first metal layer 26 (furthermore, the barrier layer 28 if present) was then removed by etching. By performing the patterning, a signal line 108 was formed, to provide a microstrip line having a characteristic impedance of 50Ω and a differential impedance of 100 Ω (FIG. 8 (vi)). More specifically, the patterning was performed so that the signal line 108 had a circuit width W of 0.47 mm and a thickness t of 20 μm. Furthermore, the patterning was finely adjusted if needed so as to provide the above characteristic impedance and differential impedance (FIG. 9). In Example 3, electroless Ni plating was performed before the electroless Au plating to guarantee adhesion between Au (electroless Au plating) and Cu (first metal layer 26). Meanwhile, the ground layer 106 was not etched. Thus, the sample 110 for transmission loss measurement having the microstrip line was obtained (FIG. 8 (vi) and FIG. 9).

The microstrip line of the obtained sample 110 for transmission loss measurement was measured for transmission loss at frequencies of 1 GHz to 50 GHz using a vector network analyzer. A ratio $S_{21}$ of transmission loss $(=(S_2/S_1) \times 100(\%))$ was obtained from transmission loss $S_1$ at a frequency of 5 GHz, and transmission loss $S_2$ at a frequency of 50 GHz. The ratio $S_{21}$ was rated and evaluated based on the following criteria.

Evaluation A: ratio $S_{21}$ of transmission loss of 330% or less
Evaluation B: ratio $S_{21}$ of transmission loss of more than 330% and 450% or less
Evaluation C: ratio $S_{21}$ of transmission loss of more than 450%

<Evaluation 2-2: Transmission Loss (Patterning Before Lamination of Resin)>

Figure 10:
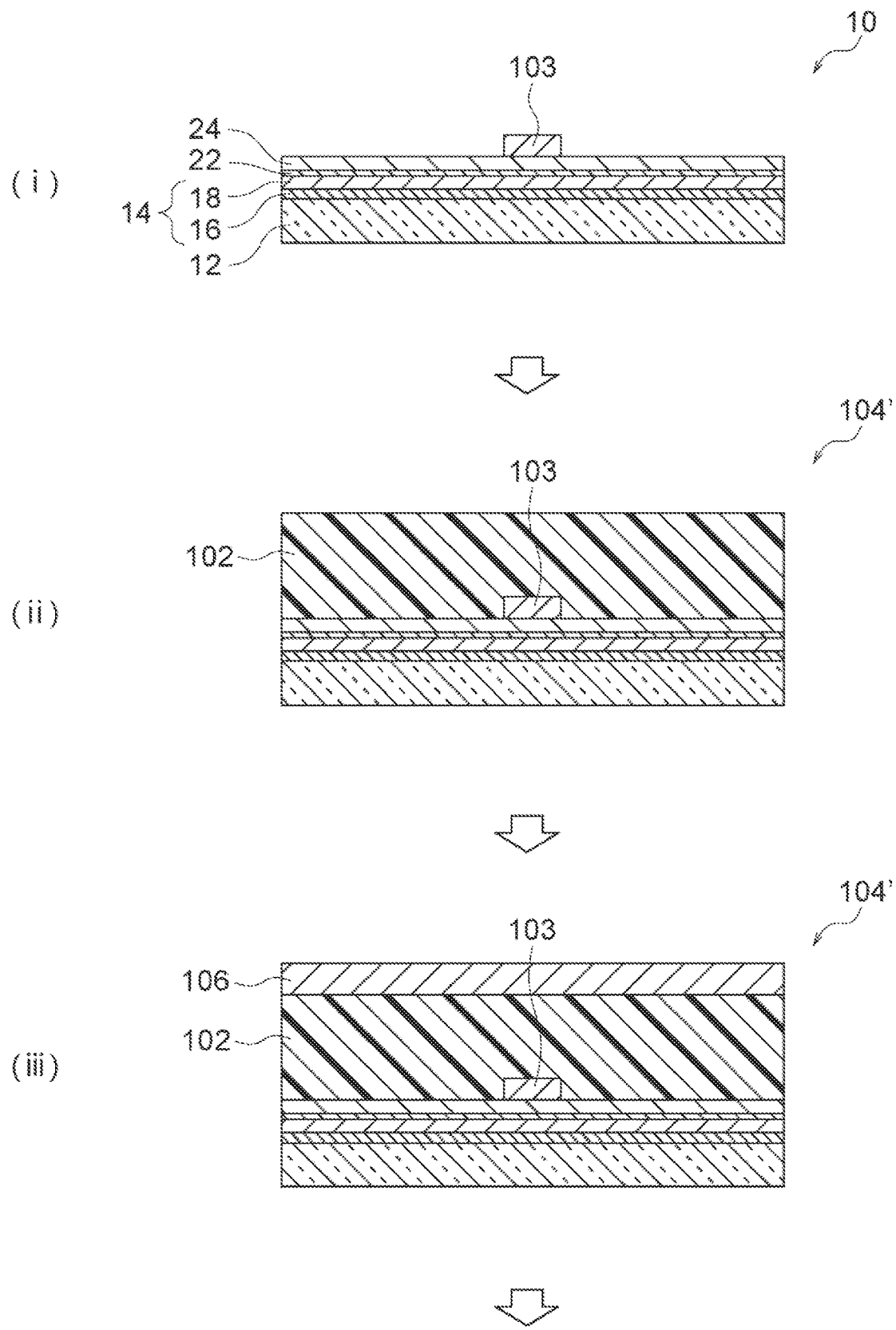
FIG. 10 is a process flow chart showing the production procedure of a sample for transmission loss measurement in Evaluation 2-2 of Examples, and showing a first half of the process (steps (i) to (iii)).
Figure 11:
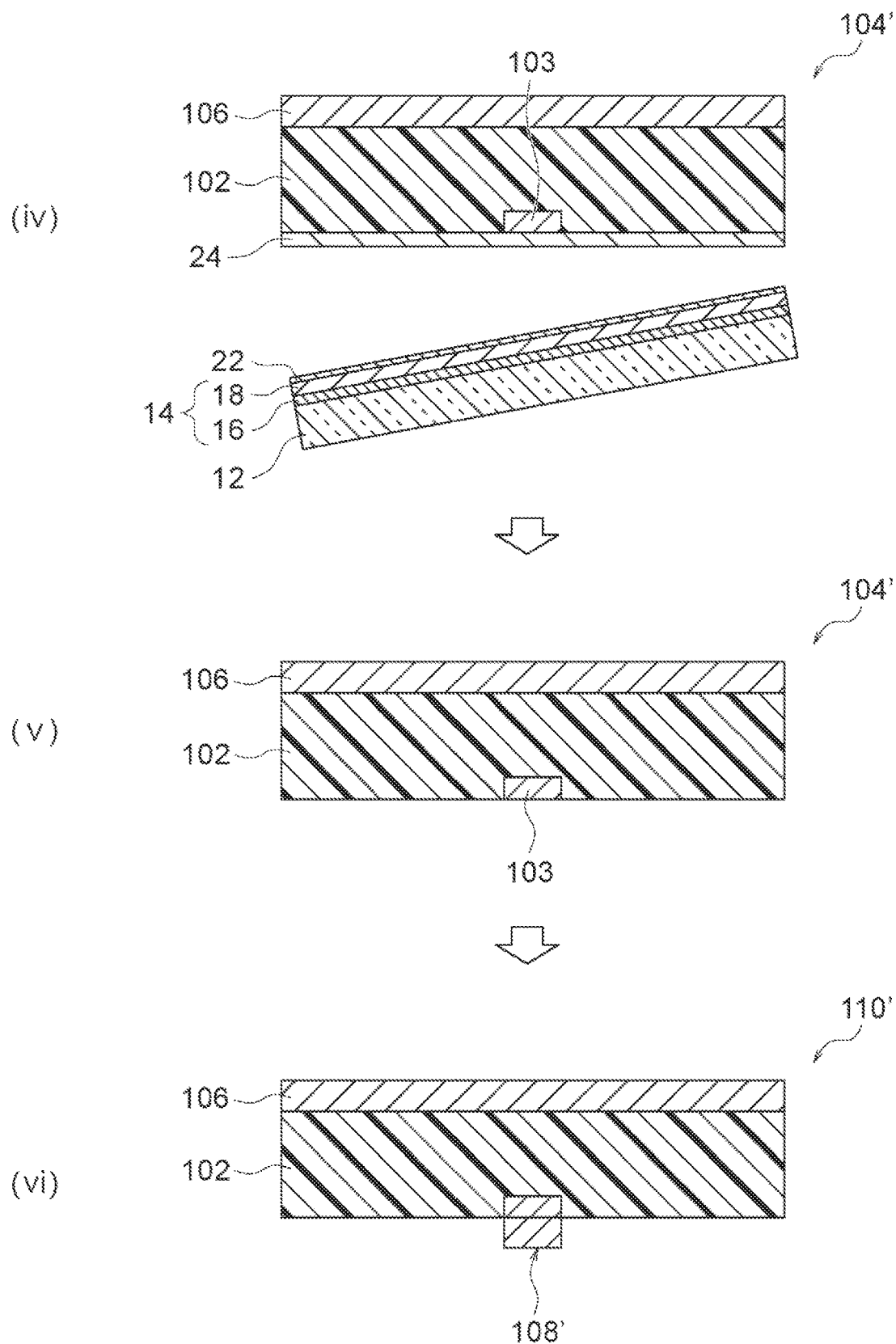
FIG. 11 is a process flow chart showing the production procedure of a sample for transmission loss measurement in Evaluation 2-2 of Examples, and showing a process following FIG. 10 (steps (iv) to (vi)).

In terms of each of the carrier-attached metal foils 10 of Examples 1 to 3 and 9 to 14, a sample 110' for transmission loss measurement was produced in procedures shown in FIGS. 10 and 11, and transmission loss of the sample 110' was measured and evaluated.

First, the surface of the first metal layer 26 of the carrier-attached metal foil 10 (the barrier layer 28 if present) was rinsed with water and dried. A photosensitive dry film was attached to the surface of the first metal layer 26 of the carrier-attached metal foil 10 (the barrier layer 28 if present), followed by exposing and developing to form a photoresist layer (not shown). An unnecessary portion of the first metal layer 26 (furthermore, the barrier layer 28 if present) was removed by etching, to form a circuit 103 for signal line. The photoresist layer was then stripped (FIG. 10 (i)).

Then, six insulating resin films (ABF-GXT31, manufactured by Ajinomoto-Fine-Techno co., inc., relative permittivity: 3.4) having a thickness of 35 μm were laminated to prepare an insulating resin substrate 102. The surface of the carrier-attached metal foil 10 in which the circuit 103 is formed on the opposite side of the career 12 (the side in which the circuit 103 was formed) was joined to one surface of the insulating resin substrate 102, followed by laminating under the conditions of a temperature of 100° C., a pressure of 0.7 MPa, and a pressing time of 90 seconds using a vacuum pressing machine. Thus, a metal-clad laminate 104' was obtained, which included the insulating resin substrate 102 having a thickness h of about 200 μm (FIG. 10 (ii)).

Next, a Cu foil having a thickness of 18 μm as a ground layer 106 was joined to the surface of the insulating resin substrate 102 of the metal-clad laminate 104' (the opposite side of the carrier-attached metal foil 10) by vacuum pressing (FIG. 10 (iii)). The vacuum pressing was performed under the conditions of a temperature of 100° C., a pressure of 0.7 MPa, and a pressing time of 120 seconds. Then, the insulating resin substrate 102 was cured. The insulating resin substrate 102 was temporarily cured at 170° C. for 30 minutes, and then fully cured at 200 CC for 60 minutes.

Then, the career 12 was released together with the release functional layer 14 at the position of the carbon layer 22 from the metal-clad laminate 104' (FIG. 11 (iv)). The circuit 103 was exposed by removing the second metal layer 24 exposed to one surface side of the metal-clad laminate 104' by etching (FIG. 11 (v)).

A photosensitive dry film (not shown) was attached to the surface of the metal-clad laminate 104' on the side of the circuit 103 (the opposite side of the ground layer 106), followed by exposing and developing so that portions other than the circuit 103 were covered with a resist. The circuit 103 which was not covered with the resist was subjected to electroless Au plating. The dry film (photoresist layer) was then stripped. By performing the patterning, a signal line 108' was formed, to provide a microstrip line having a characteristic impedance of 50Ω and a differential impedance of 100Ω (FIG. 11 (vi)). More specifically, the patterning was performed so that the signal line 108' had a circuit width W of 0.47 mm and a thickness t of 20 μm. Furthermore, the patterning was finely adjusted if needed so as to provide the above characteristic impedance and differential impedance. In Example 3, electroless Ni plating was performed before the electroless Au plating to guarantee adhesion between Au (electroless Au plating) and Cu (circuit 103). Thus, the sample 110' for transmission loss measurement was obtained, which had the microstrip line in a form in which a part of the signal line 108' (that is, the circuit 103) was incorporated in the surface of the insulating resin substrate 102 (FIG. 11 (vi)).

The microstrip line of the obtained sample 110' for transmission loss measurement was measured for transmission loss at frequencies of 1 GHz to 50 GHz using a vector network analyzer (VNA E5071C, manufactured by Agilent). A ratio $S_{21}$ $(=(S_2/S_1) \times 100(\%))$ of transmission loss was obtained from transmission loss $S_1$ at a frequency of 5 GHz, and transmission loss $S_2$ at a frequency of 50 GHz. The ratio $S_{21}$ was rated and evaluated based on the following criteria.

Evaluation A: ratio $S_{21}$ of transmission loss of 330% or less
Evaluation B: ratio $S_{21}$ of transmission loss of more than 330% and 450% or less
Evaluation C: ratio $S_{21}$ of transmission loss of more than 450%

<Evaluation 3-1: Selective Etchability (Patterning after Lamination of Resin)>

In terms of each of the carrier-attached metal foils 10 of Examples 1 to 8, a wiring pattern-attached coreless support was produced, and selective etchability of the coreless support were measured and evaluated.

First, a double-sided metal-clad laminate 107 was obtained, in which the first metal layer 26, the insulating resin substrate 102, and the ground layer 106 were laminated in this order in the same procedure as that of Evaluation 2-1. The surface of the first metal layer 26 of the double-sided metal-clad laminate 107 was rinsed with water and dried. A photosensitive dry film was attached to the surface of the first metal layer 26 of the double-sided metal-clad laminate 107, followed by exposing and developing so as to provide a pattern of line/space (L/S)=5 μm/5 μm, to form a photoresist layer. The developing was performed by a shower method at 25° C. for 2 minutes using a 1.0% by weight aqueous sodium carbonate solution as a developing solution. The exposed surface of the first metal layer 26 (that is, the portion which was not masked by the photoresist layer) was subjected to electroless Au plating, and the photoresist layer was then stripped. In such a manner, the first metal layer 26, the barrier layer 28 if present, and the electroless Au plating layer remained in the form of a wiring pattern. Meanwhile, the first metal layer 26 was exposed in the portion in which no wiring pattern was formed.

Figure 12:
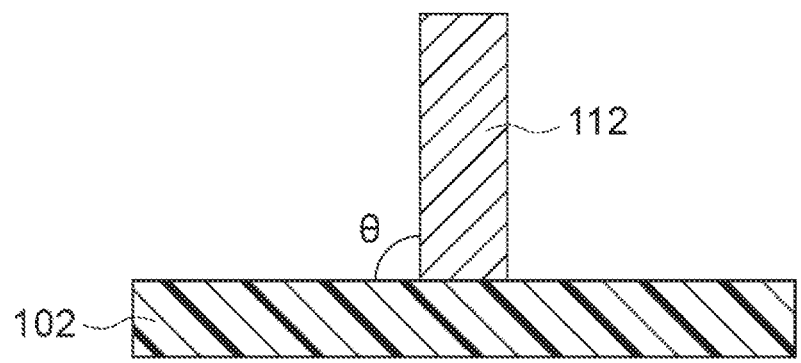
FIG. 12 is a cross-sectional schematic view showing an angle θ of an edge portion of a wiring pattern in Evaluations 3-1 and 3-2 of Examples.

Then, an unnecessary portion of the exposed first metal layer 26 and an unnecessary portion of the barrier layer 28 if present were etched away, to form a wiring pattern-attached coreless support. The cross-sectional shape of the obtained wiring pattern was observed by SEM, and as shown in FIG. 12, an angle θ of an edge portion of a wiring pattern 112 with respect to the insulating resin substrate 102 was measured. The obtained angle θ of the edge portion was rated and evaluated based on the following criteria.

Evaluation A: angle θ of edge portion of 87° or more and 93° or less

Evaluation B: angle θ of edge portion of 80° or more and less than 87°, or more than 93° and 100° or less Evaluation C: angle θ of edge portion of 60° or more and less than 80°, or more than 100° and 120° or less Evaluation D: angle θ of edge portion of less than 60° or more than 120°

<Evaluation 3-2: Selective Etchability (Patterning Before Lamination of Resin)>

Figure 13:
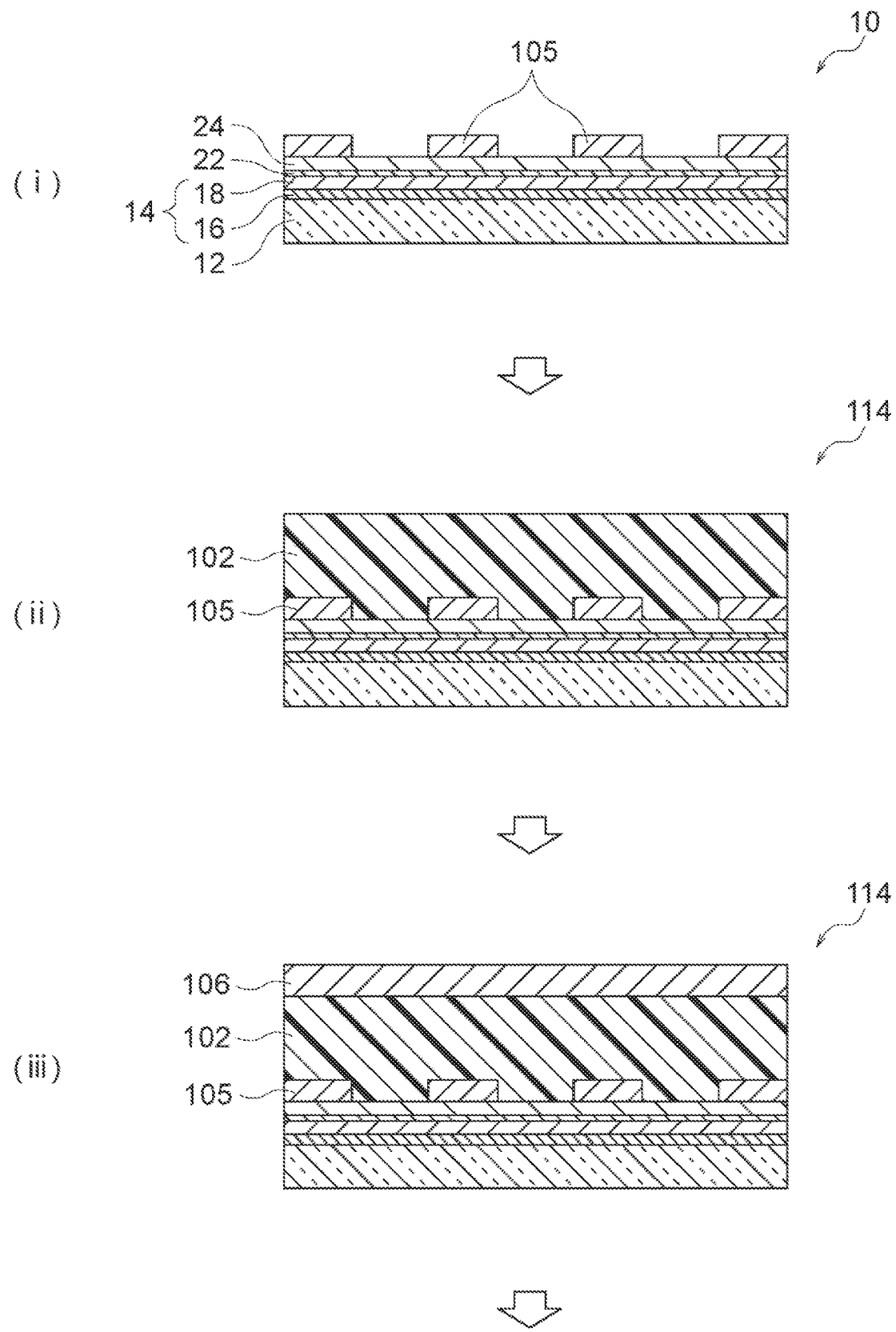
FIG. 13 is a process flow chart showing the production procedure of a coreless support in Evaluation 3-2 of Examples, and showing a first half of the process (steps (i) to (iii)).
Figure 14:
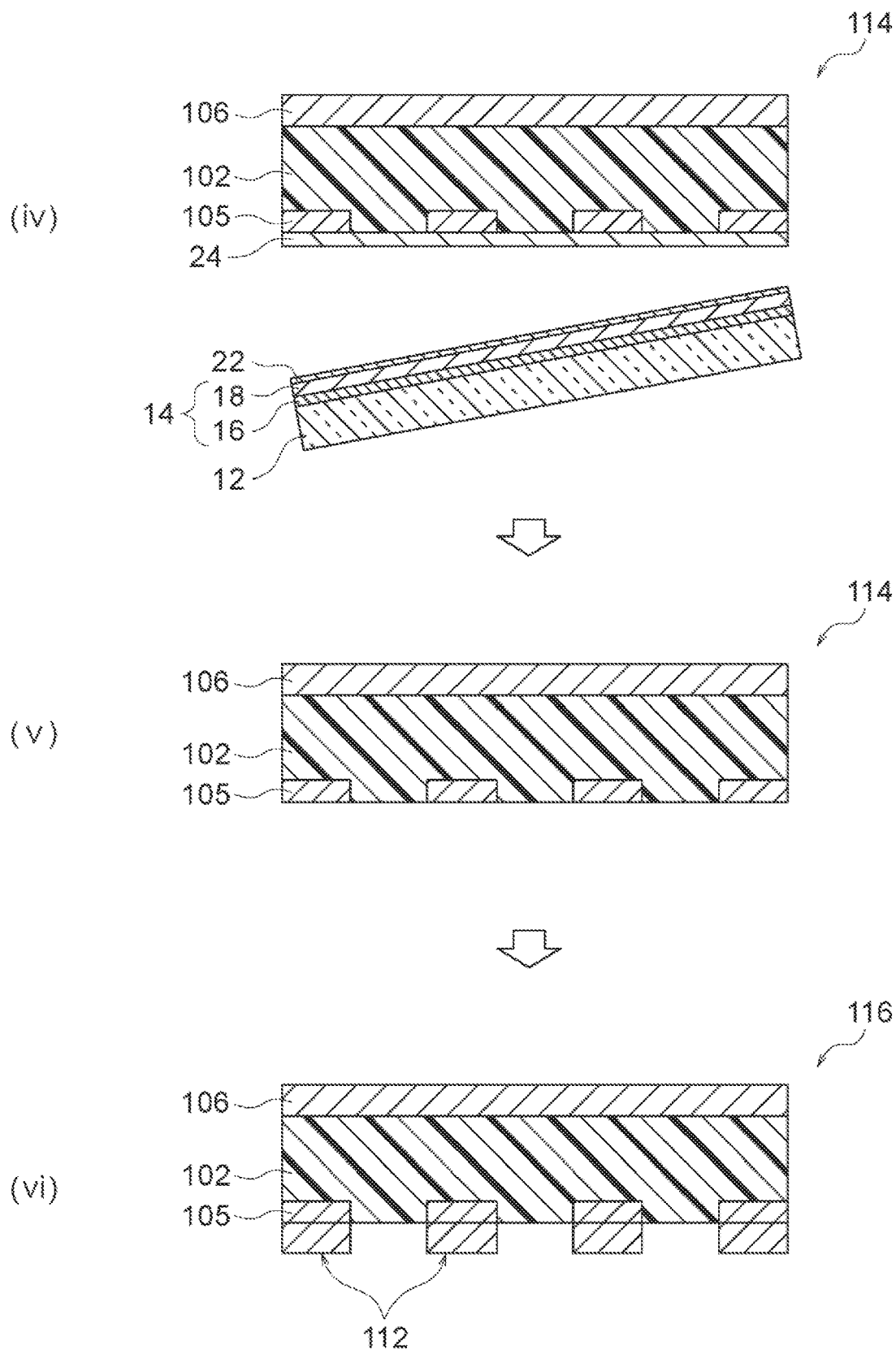
FIG. 14 is a process flow chart showing the production procedure of a coreless support in Evaluation 3-2 of Examples, and showing a process following FIG. 13 (steps (iv) to (vi)).

In terms of each of the carrier-attached metal foils 10 of Examples 1 to 3 and 9 to 14, a wiring pattern-attached coreless support 116 was produced in procedures shown in FIGS. 13 and 14, and selective etchability of the coreless support 116 were measured and evaluated.

First, the surface of the first metal layer 26 of the carrier-attached metal foil 10 (the barrier layer 28 if present) was rinsed with water and dried. A photosensitive dry film was attached to the surface of the first metal layer 26 of the carrier-attached metal foil 10 (the barrier layer 28 if present), followed by exposing and developing to form a photoresist layer (not shown). An unnecessary portion of the first metal layer 26 (furthermore, the barrier layer 28 if present) was removed by etching, to form circuits 105 of line/space (L/S)=5 μm/5 μm. The photoresist layer was then stripped (FIG. 13 (i)).

Then, an insulating resin substrate 102 was prepared, which was obtained by laminating six insulating resin films (ABF-GXT31, manufactured by Ajinomoto-Fine-Techno co., inc., relative permittivity: 3.4) having a thickness of 35 μm. The surface of the carrier-attached metal foil 10 in which the circuits 105 is formed on the opposite side of the career 12 (the side in which the circuits 105 were formed) was joined to one surface of the insulating resin substrate 102, followed by laminating under the conditions of a temperature of 100° C., a pressure of 0.7 MPa, and a pressing time of 90 seconds using a vacuum pressing machine. Thus, a metal-clad laminate 114 was obtained, which included the insulating resin substrate 102 having a thickness h of about 200 μm (FIG. 13 (ii)).

Then, a Cu foil having a thickness of 18 μm as a ground layer 106 was joined to the surface of the insulating resin substrate 102 of the metal-clad laminate 114 (the opposite side of the carrier-attached metal foil 10) by vacuum pressing in the same procedure as that of Evaluation 2-2 (FIG. 13 (iii)). The career 12 was released together with the release functional layer 14 at the position of the carbon layer 22 from the metal-clad laminate 114 (FIG. 14 (iv)). The circuits 105 were exposed by removing the second metal layer 24 exposed to one surface side of the metal-clad laminate 114 by etching (FIG. 14 (v)). The surface of the metal-clad laminate 114 on the side of the circuits 105 was rinsed with water and dried.

Then, a photosensitive dry film (not shown) was attached to the surface of the metal-clad laminate 114 on the side of the circuits 105 (the opposite side of the ground layer 106), followed by exposing and developing so that portions other than the circuits 105 were covered with a resist. The developing was performed under the same conditions as those of Evaluation 3-1. The circuits 105 which were not covered with the resist was subjected to electroless Au plating. The dry film (photoresist layer) was then stripped. Thus, a coreless support 116 having a wiring pattern 112 of line/space (L/S)=5 μm/5 μm was formed (FIG. 14 (vi)). The cross-sectional shape of the obtained wiring pattern was observed by SEM, and as shown in FIG. 12, an angle θ of an edge portion of the wiring pattern 112 with respect to the insulating resin substrate 102 was measured. The obtained angle θ of the edge portion was rated and evaluated based on the same criteria as those of Evaluation 3-1.

<Evaluation 4: Cu Plating Interconnection Resistance>

Figure 15:
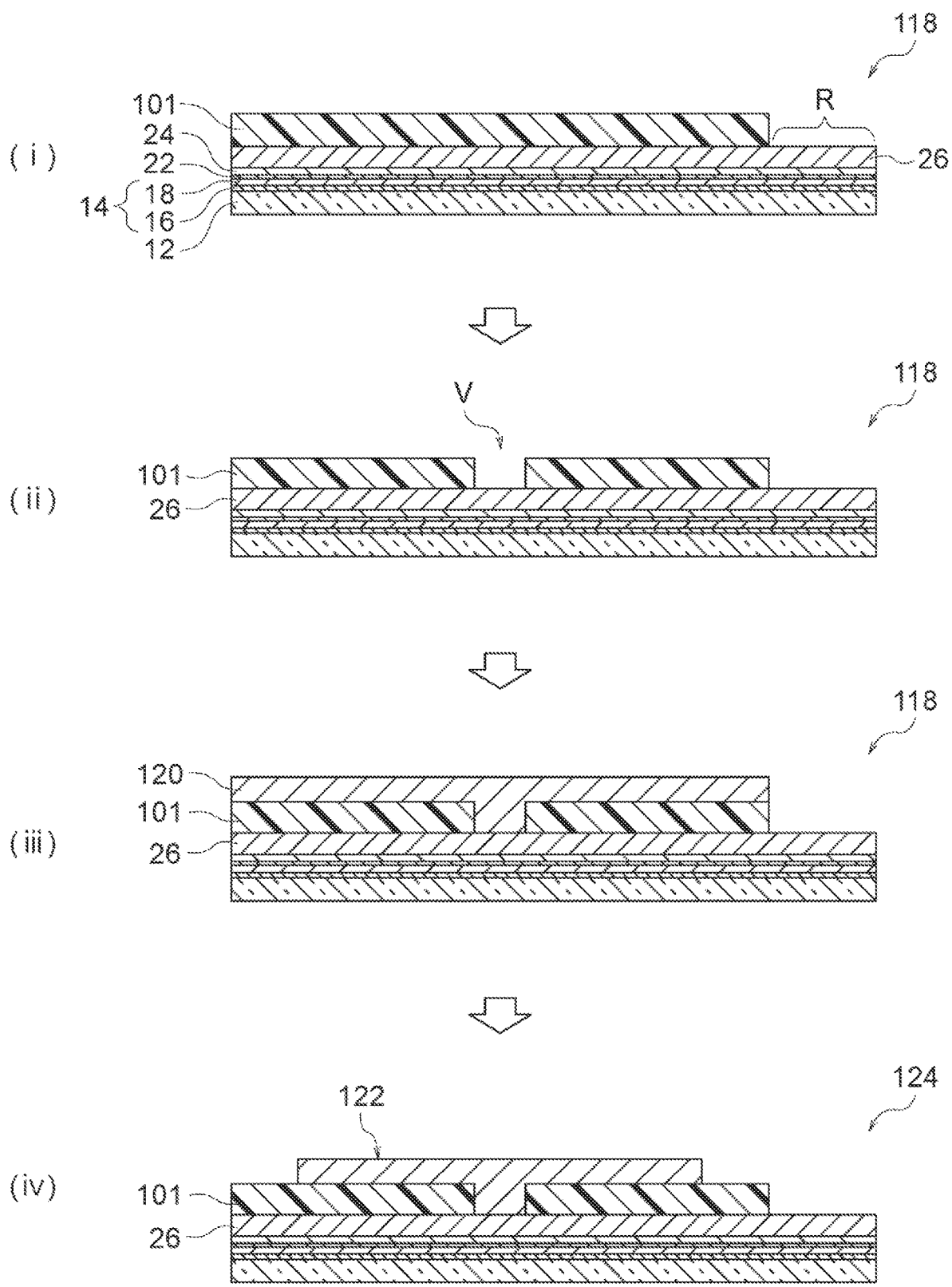
FIG. 15 is a process flow chart showing the production procedure (steps (i) to (iv)) of a sample for interconnection resistance measurement in Evaluation 4 of Examples.

In terms of each of the carrier-attached metal foils 10 of Examples 1 and 2 and 4 to 14, a sample 124 for interconnection resistance measurement was produced in procedures shown in FIG. 15, and Cu plating interconnection resistance of the sample 124 was evaluated.

First, the first metal layer 26 of the carrier-attached metal foil 10 (the barrier layer 28 if present) was joined to an insulating resin film 101 (ABF-GXT31, manufactured by Ajinomoto-Fine-Techno co., inc., relative permittivity: 3.4) having a thickness of 35 μm, followed by vacuum pressing and curing the insulating resin film to obtain a metal-clad laminate 118 (FIG. 15 (i)). Here, the vacuum pressing and the curing of the insulating resin film 101 were performed under the same conditions as those of the joining of the metal-clad laminate 104 and the ground layer 106 in Evaluation 2-1. As shown in FIG. 15 (i), in order to carry out I-V measurement to be described later, a region R in which the first metal layer 26 (the barrier layer 28 if present) was exposed (that is, the insulating resin film 101 was not joined) was provided in the metal-clad laminate 118.

Then, a via V was formed in the metal-clad laminate 118 using a $CO_2$ laser. The via V extended through the insulating resin film 101 to reach the first metal layer 26 (the barrier layer 28 if present), and had a diameter of 30 μm (FIG. 15 (ii)). Then, a range between the bottom part of the via V and the surface of the insulating resin film 101 was subjected to Cu plating 120 so as to cover the range (FIG. 15 (iii)). The Cu plating 120 was formed by subjecting the surface of the insulating resin film 101, the side surface of the via V, and the bottom face of the via V to electroless Cu plating having a thickness of about 1 μm, and then applying a via fill by electrodeposited Cu plating. The thickness of the Cu plating 120 was 55 μm (the thickness of the via V: about 35 μm, and the thickness of the portion covering the surface of the insulating resin film 101: about 20 µm). A photosensitive dry film was attached to the surface of the Cu plating 120 of the metal-clad laminate 118, followed by exposing and developing to form a photoresist layer (not shown) of 300 µm×300 µm so as to cover the via V. An unnecessary portion of the Cu plating 120 (that is, the portion which was not covered with the photoresist layer) was removed by etching, and the photoresist layer was then stripped to obtain the sample 124 for interconnection resistance measurement in which a Cu electrode 122 is formed (FIG. 15 (iv)).

Figure 16:
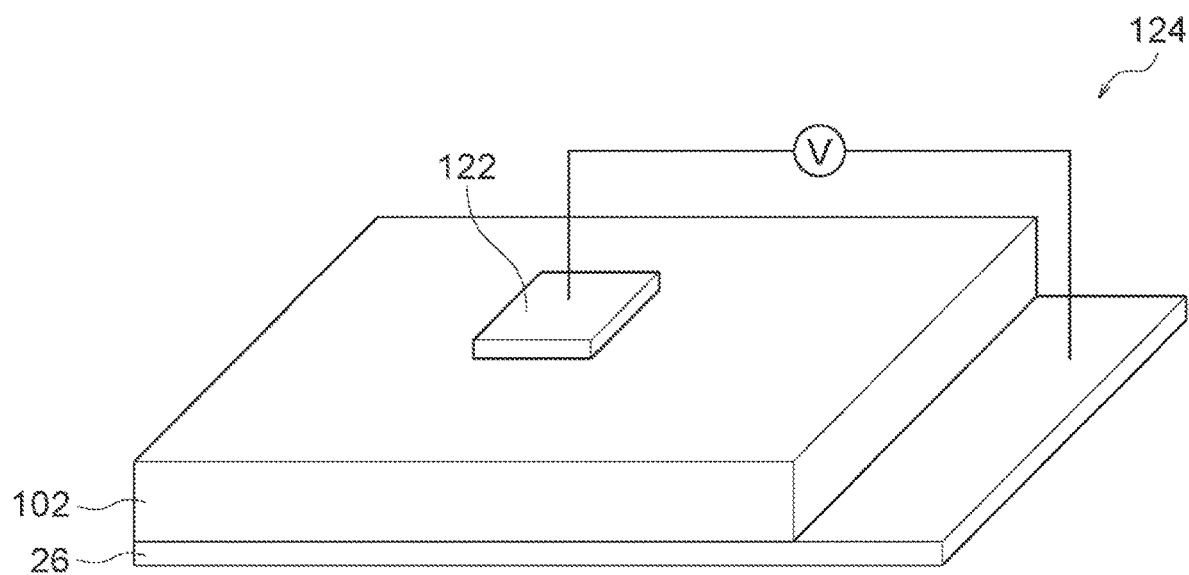
FIG. 16 is a schematic view showing I-V measurement using the sample for interconnection resistance measurement in Evaluation 4 of Examples.

In the obtained sample 124 for interconnection resistance measurement, the first metal layer 26 (the barrier layer 28 if present) and the Cu electrode 122 were subjected to I-V measurement to calculate interconnection resistance of Cu plating (resistance $R_1$ before HAST test) (see FIG. 16). The measurement was performed using a four-terminal method. The sample 124 for interconnection resistance measurement was subjected to an HAST test (85° C., 85% RH, 200 hours), and the first metal layer 26 (the barrier layer 28 if present) and the Cu electrode 122 were then subjected to I-V measurement again to calculate interconnection resistance of the Cu plating after the HAST test (resistance $R_2$ after HAST test). A resistance increase rate after and before the HAST test ($=((R_2-R_1)/R_1)\times100(\%)$) was obtained, and it was rated and evaluated based on the following criteria. Four samples 124 for interconnection resistance measurement were prepared, and the average value of the results was used for evaluation.

Evaluation A: resistance increase rate after and before HAST test of 10% or less
Evaluation B: resistance increase rate after and before HAST test of more than 10% and 20% or less
Evaluation C: resistance increase rate after and before HAST test of more than 20% and 50% or less
Evaluation D: resistance increase rate after and before HAST test of more than 50%

The invention claimed is:

1. A carrier-attached metal foil comprising:
   (a) a carrier;
   (b) a release functional layer provided on the carrier, the release functional layer including:
      (b1) an adhesion layer disposed closer to the carrier and having a thickness of more than 10 nm and less than 200 nm; and
      (b2) a release assistance layer disposed farther from the carrier and having a thickness of 50 nm or more and 500 nm or less; and
   (c) a composite metal layer provided on the release functional layer, the composite metal layer including:
      (c1) a carbon layer disposed closer to the release assistance layer; and
      (c2) a first metal layer disposed farther from the release assistance layer and mainly composed of Au or Pt.

2. The carrier-attached metal foil according to claim 1, wherein the career is composed of glass, silicon, or a ceramic.

3. The carrier-attached metal foil according to claim 1, wherein the release functional layer includes at least one layer containing 80 atom % or more of at least one selected from the group consisting of Cu, Ti, Ta, Cr, Ni, Al, Mo, Zn, W, TiN, and TaN as the adhesion layer and/or the release assistance layer.

4. The carrier-attached metal foil according to claim 1, wherein a ratio $T_2/T_1$ of a thickness $T_2$ of the release assistance layer to a thickness $T_1$ of the adhesion layer is more than 1 and 20 or less.

5. The carrier-attached metal foil according to claim 1, wherein the carbon layer contains amorphous carbon.

6. The carrier-attached metal foil according to claim 1, wherein the first metal layer has a thickness of 50 nm or more and 2000 nm or less.

7. The carrier-attached metal foil according to claim 1, wherein the composite metal layer further includes:
   (c3) a second metal layer provided between the carbon layer and the first metal layer and containing 50 atom

TABLE 1

| | | Ex. 1 | Ex. 2 | Ex. 3* | Ex. 4 | Ex. 5 | Ex. 6 | Ex. 7 | Ex. 8 | Ex. 9 | Ex. 10 | Ex. 11 | Ex. 12 | Ex. 13* | Ex. 14* |
|---|---|---|---|---|---|---|---|---|---|---|---|---|---|---|---|
| Constitution of career-attached metal foil | First metal layer | Au | Au | Cu | Au | Au | Au | Au | Au | Au | Au | Au | Au | Au | Au |
| | Second metal layer | Ti | Ti | Ti | Ta | Ni | W | Cr | Pd | Ti | Ti | Ti | Ti | Ti | Ti |
| | Barrier layer | — | Ni | — | Ta | Ni | W | Cr | Pd | Ni | Ni | Ni | Ni | Ni | Ni |
| | Thickness of adhesion layer $T_1$ (nm) | | | | 50 | | | | | 50 | 50 | 100 | 150 | 10 | 200 |
| | Thickness of release assistance layer $T_2$ (nm) | | | | 200 | | | | | 300 | 100 | 50 | 500 | 30 | 600 |
| | $T_2/T_1$ | | | | 4 | | | | | 6 | 2 | 0.5 | 3.3 | 3 | 3 |
| Evaluations | Evaluation 1 | Releasability | B | B | B | B | B | B | B | B | A | B | C | B | D | D |
| | Evaluation 2-1 | Transmission loss (Patterning after lamination of resin) | B | A | C | B | A | A | B | B | — | — | — | — | — | — |
| | Evaluation 2-2 | Transmission loss (Patterning before lamination of resin) | B | A | C | — | — | — | — | — | A | B | B | B | B | B |
| | Evaluation 3-1 | Selective etchability (Patterning after lamination of resin) | B | B | B | B | B | B | B | B | — | — | — | — | — | — |
| | Evaluation 3-2 | Selective etchability (Patterning before lamination of resin) | A | A | B | — | — | — | — | — | A | A | A | A | A | A |
| | Evaluation 4 | Cu plating interconnection resistance | D | A | — | B | A | A | A | B | A | A | A | A | A | A |

*represents Comparative Examples.

% or more of at least one selected from the group consisting of Ti Ni, W, Cr, and Pd.

8. The carrier-attached metal foil according to claim 7, wherein the second metal layer has a thickness of 50 nm or more and 1000 nm or less.

9. The carrier-attached metal foil according to claim 1, wherein the composite metal layer further includes:
- (c4) a barrier layer provided on a surface of the first metal layer disposed farther from the carbon layer, and containing a total of 50 atom % or more of at least one selected frot the group consisting of Ti, Ta Ni, W, Cr, and Pd.

10. The carrier-attached metal foil according to claim 1, wherein the carrier-attached metal foil is used for manufacture of a millimeter-wave antenna substrate.

11. A method for manufacturing a millimeter-wave antenna substrate, comprising manufacturing the millimeter-wave antenna substrate using the carrier-attached metal foil according to claim 1.

\* \* \* \* \*